United States Patent
Lee et al.

(12)

(10) Patent No.: US 12,360,639 B2
(45) Date of Patent: Jul. 15, 2025

(54) DISPLAY DEVICE

(71) Applicant: SAMSUNG DISPLAY CO., LTD., Yongin-si (KR)

(72) Inventors: Hyeon Bum Lee, Yongin-si (KR); Joon Woo Bae, Yongin-si (KR); Hyun Ho Kim, Yongin-si (KR); Hyoeng Ki Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/531,955

(22) Filed: Dec. 7, 2023

(65) Prior Publication Data

US 2024/0302928 A1 Sep. 12, 2024

(30) Foreign Application Priority Data

Mar. 8, 2023 (KR) .......................... 10-2023-0030671

(51) Int. Cl.
*G06F 3/044* (2006.01)
*G06F 3/041* (2006.01)
*H10K 59/122* (2023.01)
*H10K 59/40* (2023.01)

(52) U.S. Cl.
CPC .......... *G06F 3/0445* (2019.05); *G06F 3/0412* (2013.01); *H10K 59/122* (2023.02); *H10K 59/40* (2023.02); *G06F 2203/04111* (2013.01)

(58) Field of Classification Search
CPC ................ G06F 3/0445; G06F 3/0412; G06F 2203/04111; H10K 59/40; H10K 59/122

USPC .................................................. 345/173–174
See application file for complete search history.

(56) References Cited

U.S. PATENT DOCUMENTS

| | | | |
|---|---|---|---|
| 10,541,282 B2 * | 1/2020 | Oh ........................ | G06F 3/0443 |
| 2018/0095582 A1 * | 4/2018 | Hwang ................. | G06F 3/0412 |
| 2018/0358413 A1 * | 12/2018 | Lee ....................... | G06F 3/04164 |
| 2021/0200407 A1 * | 7/2021 | Jang ...................... | G06F 3/0446 |

(Continued)

FOREIGN PATENT DOCUMENTS

| | | |
|---|---|---|
| KR | 10-2015-0017380 | 2/2015 |
| KR | 10-2021-0054390 | 5/2021 |
| KR | 10-2021-0083816 | 7/2021 |

(Continued)

*Primary Examiner* — Kwin Xie
(74) *Attorney, Agent, or Firm* — F. CHAU & ASSOCIATES, LLC

(57) ABSTRACT

A display device includes a substrate comprising emission and non-emission areas. A light-emitting element overlaps the emission area and is on the substrate. A thin-film encapsulation layer overlaps with the emission and non-emission areas and is on the light-emitting element. A touch sensor layer is on the thin-film encapsulation layer. The touch sensor layer comprises a first conductive layer on the thin-film encapsulation layer. A touch insulating layer is on the first conductive layer. A second conductive layer is on the touch insulating layer. The touch insulating layer overlaps with the non-emission area and comprises a first surface facing the thin-film encapsulation layer. A second surface is opposite to the first surface and has a width in a first direction greater than that of the first surface. An inclined surface connects the first and second surfaces. The second conductive layer covers the second surface and the inclined surface.

20 Claims, 16 Drawing Sheets

(56) References Cited

U.S. PATENT DOCUMENTS

2022/0019305 A1* 1/2022 Ye ........................ G06F 3/0412
2024/0192821 A1* 6/2024 Jeong ................... G06F 3/0412

FOREIGN PATENT DOCUMENTS

KR      10-2374168      3/2022
KR   10-2022-0096758    7/2022

* cited by examiner

330: BE1
350: TE, RE
EA: EA1, EA2, EA3, EA4

DISPLAY DEVICE

This application claims priority under 35 U.S.C. § 119 to Korean Patent Application No. 10-2023-0030671, filed on Mar. 8, 2023 in the Korean Intellectual Property Office, the disclosure of which is incorporated by reference in its entirety herein.

1. TECHNICAL FIELD

The present disclosure relates to a display device.

2. DISCUSSION OF RELATED ART

Display devices for displaying images are being applied to an increasingly wide array of electronic devices along with the advancement of the information-oriented society. For example, display devices are being applied to electronic devices such as smart phones, digital cameras, laptop computers, navigation devices, and smart televisions.

Recently, a touch member that can detect a touch input is employed in a display device for smart phones and tablet PCs. Such a touch member may be formed directly on a display panel to simplify the manufacturing process and to reduce the thickness of the display device.

Such a display device includes a display panel for generating and displaying images and various input means. Recently, a touch panel that recognizes a touch input has been widely employed for display devices of smart phones or tablet PCs. The touch panel determines whether a touch input is received. If a touch input is received, the touch panel finds the coordinates of the position of the touch input.

SUMMARY

According to an embodiment of the present invention, a display device includes a substrate comprising an emission area and a non-emission area. A light-emitting element overlaps with the emission area and is disposed on the substrate. A thin-film encapsulation layer overlaps with the emission area and the non-emission area and is disposed on the light-emitting element. A touch sensor layer is disposed on the thin-film encapsulation layer. The touch sensor layer comprises a first conductive layer disposed on the thin-film encapsulation layer. A touch insulating layer is disposed on the first conductive layer. A second conductive layer is disposed on the touch insulating layer. The touch insulating layer overlaps with the non-emission area and comprises a first surface facing the thin-film encapsulation layer. A second surface of the touch insulating layer is opposite to the first surface. The second surface has a width in a first direction that is greater than a width of the first surface in the first direction. An inclined surface of the touch insulating layer connects the first surface with the second surface. The second conductive layer covers the second surface and the inclined surface of the touch insulating layer.

In an embodiment, the first conductive layer may overlap with the non-emission area. The first conductive layer and the touch insulating layer are arranged in a mesh pattern. A width of the touch insulating layer in the first direction is greater than a width of the first conductive layer in the first direction.

In an embodiment, the touch sensor layer may further comprise a touch buffer layer overlapping with the non-emission area and disposed between the thin-film encapsulation layer and the touch insulating layer. A touch protective layer overlaps with the non-emission area and is disposed on the second conductive layer. An angle defined by the inclined surface of the touch insulating layer facing the touch protective layer and the touch buffer layer may be an acute angle.

In an embodiment, the touch insulating layer may have a reverse tapered shape and comprises an insulating material.

In an embodiment, the second conductive layer may be a single layer made of a compound selected from molybdenum (Mo), aluminum (Al), chromium (Cr), gold (Au), titanium (Ti), nickel (Ni), neodymium (Nd) and copper (Cu) and an alloy thereof.

In an embodiment, the display device may further comprise a pixel-defining layer overlapping with the non-emission area and partially in contact with the light-emitting element. A first opening overlaps with the emission area and is defined by the pixel-defining layer. A second opening overlaps with the emission area and is defined by the touch insulating layer.

In an embodiment, a width of the second opening in the first direction may be greater than a width of the first opening.

In an embodiment, the touch insulating layer may cover both ends of the first conductive layer in the first direction. The touch insulating layer includes a touch contact hole penetrating through a center of the touch insulating layer. The first conductive layer and the second conductive layer may be electrically connected with each other by the touch contact hole.

In an embodiment, the non-emission area may comprise a first area and a second area. The first area and the second area may include the touch insulating layer and the second conductive layer. The first area may include the first conductive layer. The second area does not include the first conductive layer.

In an embodiment, the first conductive layer may comprise a connection electrode. The second conductive layer may comprise a driving electrode and a sensing electrode.

In an embodiment, the second conductive layer may comprise a first metal layer disposed on the touch insulating layer. A third metal layer is on the first metal layer. A second metal layer is disposed between the first metal layer and the third metal layer. The third metal layer may completely cover the first metal layer and the second metal layer. Reflectances of the third metal layer may be lower than that of the first metal layer and the second metal layer.

In an embodiment, the first metal layer and the third metal layer of the second conductive layer may comprise titanium (Ti). The second metal layer may be made of a compound selected from molybdenum (Mo), aluminum (Al), chromium (Cr), gold (Au), nickel (Ni), neodymium (Nd) and copper (Cu) and an alloy thereof.

According to an embodiment of the present invention, a display device may comprise a substrate comprising an emission area and a non-emission area. A light-emitting element overlaps with the emission area and is disposed on the substrate. A thin-film encapsulation layer overlaps with the emission area and the non-emission area and is disposed on the light-emitting element. A touch sensor layer is disposed on the thin-film encapsulation layer. The touch sensor layer may comprise a first conductive layer disposed on the thin-film encapsulation layer. A touch insulating layer is disposed on the first conductive layer. A second conductive layer is disposed on the touch insulating layer. The second conductive layer overlaps with the non-emission area and may comprise a first surface facing the thin-film encapsulation layer. A second surface of the second conductive layer is opposite to the first surface and has a width in a first direction greater than a width of the first surface in the first direction. An inclined surface of the second conductive layer connects the first surface with the second surface. The second conductive layer may have a reverse tapered shape.

In an embodiment, the touch insulating layer may overlap with the non-emission area. The first conductive layer and the touch insulating layer may be arranged in a mesh pattern. A width of the touch insulating layer in the first direction may be less than a width of the second conductive layer in the first direction.

In an embodiment, the touch sensor layer may further comprise a touch buffer layer disposed between the thin-film encapsulation layer and the touch insulating layer. A touch protective layer is disposed on the second conductive layer. An angle defined by the inclined surface of the second conductive layer facing the touch protective layer and the touch buffer layer may be an acute angle.

According to an embodiment of the present invention, a display device may comprise a substrate comprising a display area and a non-display area, the display area comprising an emission area and a non-emission area. A thin-film encapsulation layer overlaps with the display area and the non-display area and is disposed on the substrate. A touch insulating layer is disposed on the thin-film encapsulation layer and overlaps with the non-emission area and the non-display area. A touch electrode overlaps with the non-emission area and covers the touch insulating layer. A touch signal line overlaps with the non-display area and covers the touch insulating layer. The touch insulating layer has a reverse tapered shape. The touch signal line comprises a first surface facing the thin-film encapsulation layer. A second surface of the touch signal line is opposite to the first surface and has a width in a first direction that is greater than a width of the first surface in the first direction. An inclined surface of the touch signal line connects the first surface with the second surface, and covers the touch insulating layer.

In an embodiment, a width of the touch insulating layer in the first direction may be less than a width of the touch signal line.

In an embodiment, a display device may comprise a touch buffer layer overlapping with the non-display area and disposed between the thin-film encapsulation layer and the touch insulating layer. A touch protective layer overlaps with the non-display area and is disposed on the touch signal line. An angle formed by the touch buffer layer and the inclined surface facing the touch protective layer is an acute angle.

In an embodiment, the touch signal line may be connected to the touch electrode and may have a reverse tapered shape.

In an embodiment, the touch signal line may be a single layer made a compound selected from molybdenum (Mo), aluminum (Al), chromium (Cr), gold (Au), titanium (Ti), nickel (Ni), neodymium (Nd) and copper (Cu) and an alloy thereof.

In a touch panel including two conductive layers, light coming from outside a display device may be reflected off a side surface of a metal of the conductive layers.

If the light from outside the display device is reflected and recognized by a user's eyes, the quality of images may be degraded.

It should be noted that objects of the present disclosure are not necessarily limited to the above-mentioned object; and other objects of embodiments the present disclosure will be apparent to those skilled in the art from the following descriptions.

BRIEF DESCRIPTION OF THE DRAWINGS

The above and other aspects and features of the present disclosure will become more apparent by describing in detail non-limiting embodiments thereof with reference to the attached drawings, in which.

DETAILED DESCRIPTION OF EMBODIMENTS

Embodiments of the present disclosure will now be described more fully hereinafter with reference to the accompanying drawings. The present disclosure may, however, be embodied in different forms and should not be construed as limited to the described embodiments set forth herein. The same reference numbers indicate the same components throughout the specification and the drawings. In the attached drawings, various thicknesses, lengths, and angles are shown and while the arrangement shown does indeed represent an embodiment of the present invention, it is to be understood that modifications of the various thicknesses, lengths, and angles may be possible within the spirit and scope of the present disclosure and the present disclosure is not necessarily limited to the particular thicknesses, lengths, and angles shown.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third," or the like may be used herein to describe various elements, these elements should not necessarily be limited by these terms. These terms may be used to distinguish one element from another element or for the convenience of description and explanation thereof. For example, when "a first element" is discussed in the description, it may be termed "a second element" or "a third element," and "a second element" and "a third element" may be termed in a similar manner without departing from the spirit and scope of the present disclosure.

Hereinafter, embodiments of the present disclosure will be described in detail with reference to the accompanying drawings.

Figure 1:
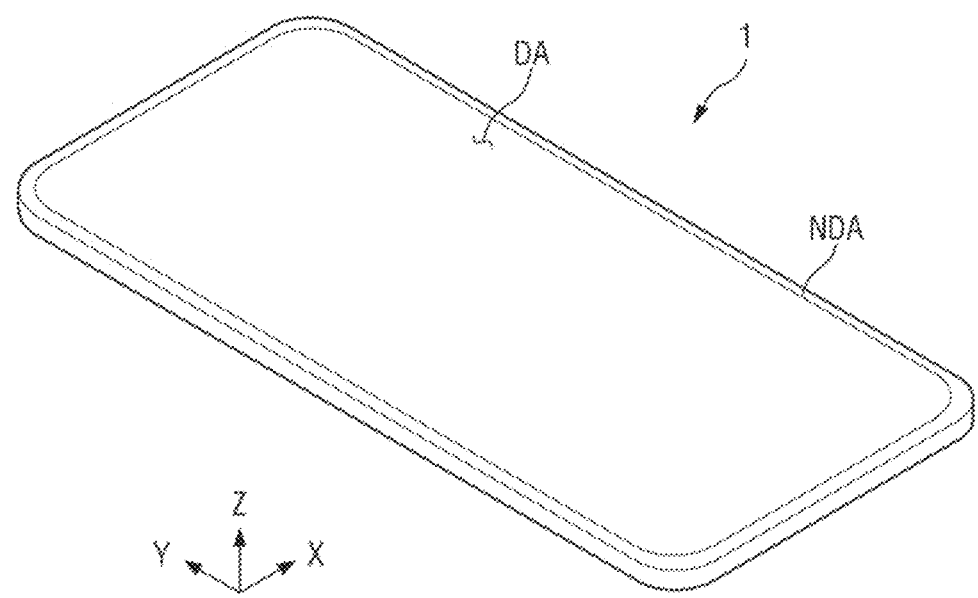
FIG. 1 is a perspective view of an electronic device according to an embodiment of the present disclosure.

FIG. 1 is a perspective view of an electronic device according to an embodiment of the present disclosure.

Referring to FIG. 1, an electronic device 1 displays at least one moving image and/or still image. The electronic device 1 may refer to any electronic device that provides a display screen. For example, in an embodiment the electronic device 1 may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

In FIG. 1, a first direction X, a second direction Y and a third direction Z are defined. In an embodiment, the first direction X and the second direction Y may be perpendicular to each other. The first direction X and the third direction Z may be perpendicular to each other. The second direction Y and the third direction Z may be perpendicular to each other. However, embodiments of the present disclosure are not necessarily limited thereto and the first to third directions X, Y, Z may cross each other at various different angles in some embodiments. The first direction X may refer to the horizontal direction in the drawings, the second direction Y may refer to the vertical direction in the drawings, and the third direction Z may refer to the up-and-down direction, such as the thickness direction in the drawings. As used herein, a direction may refer to the direction indicated by the arrow as well as the opposite direction, unless specifically stated otherwise. If it is necessary to discern between such two opposite directions, one of the two directions may be referred to as "one side in the direction," while the other direction may be referred to as "the opposite side in the direction." In FIG. 1, the side indicated by an arrow indicative of a direction is referred to as a first side in the direction, while the opposite side is referred to as the second side in the direction.

In the following description of the surfaces of the electronic device 1 or the elements of the electronic device 1, the surface facing one side where images are displayed, such as the side indicated by the arrow in the third direction DR3 will be referred to as the upper surface, while the opposite surface will be referred to as the lower surface, for convenience of illustration. It should be understood, however, that embodiments of the present disclosure are not necessarily limited thereto. The surfaces and the opposite surface of each of the elements may be referred to as a front surface and a rear surface, respectively, or may be referred to as a first surface and a second surface, respectively. In addition, in the description of relative positions of the elements of the electronic device 1, the first side in the third direction Z may be referred to as the upper side while the opposite second side in the third direction Z may be referred to as the lower side.

The electronic device 1 may include a display device 10 (see FIG. 2) for providing a display screen. Examples of the display device may include an inorganic light-emitting diode display device, an organic light-emitting display device, a quantum-dot light-emitting display device, a plasma display device, a field emission display device, etc. In the following description, an organic light-emitting diode display device is employed as an example of the display device 10 for convenience of description. However, embodiments of the present disclosure are not necessarily limited thereto.

The shape of the electronic device 1 may be modified in a variety of ways. For example, the electronic device 1 may have shapes such as a rectangle with longer lateral sides, a rectangle with longer vertical sides, a square, a quadrangle with rounded corners (e.g., vertices), other polygons, a circle, etc. The shape of a display area DA of the electronic device 1 may also be similar to the overall shape of the electronic device 1. In an embodiment shown in FIG. 1, the electronic device 1 has a rectangular shape with the longer sides in the second direction Y.

The electronic device 1 may include the display area DA and a non-display area NDA. In the display area DPA, images can be displayed. In the non-display area NDA, images are not displayed. The display area DPA may be referred to as an active area, while the non-display area NDA may also be referred to as an inactive area. In an embodiment, the display area DA may generally occupy the center of the electronic device 1. However, embodiments of the present disclosure are not necessarily limited thereto.

Figure 2:
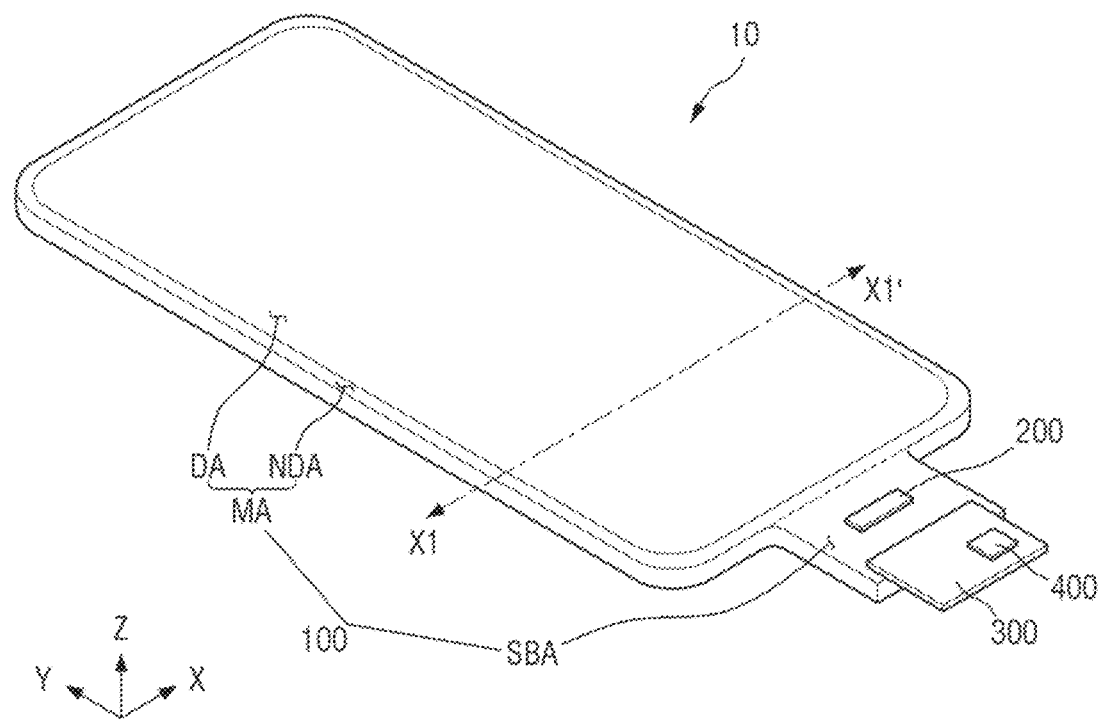
FIG. 2 is a perspective view showing a display device included in an electronic device according to an embodiment of the present disclosure.

FIG. 2 is a perspective view showing a display device included in an electronic device according to an embodiment of the present disclosure.

Referring to FIG. 2, the electronic device 1 according to an embodiment of the present disclosure may include a display device 10. The display device 10 may provide a display screen where images are displayed in the electronic device 1. The display device 10 may have a shape similar to that of the electronic device 1 when viewed from the top. For example, in an embodiment the display device 10 may have a shape similar to a rectangle having shorter sides in the first direction X and longer sides in the second direction Y when viewed from the top. In an embodiment, the corners where the shorter sides in the first direction X meet the longer sides in the second direction Y may be rounded with a predetermined curvature. It should be understood, however, that embodiments of the present disclosure are not necessarily limited thereto. For example, in an embodiment the corners may be formed at a right angle. The shape of the display device 10 when viewed from the top is not necessarily limited to a quadrangular shape, but may be formed in a shape similar to other polygonal shapes, a circular shape, or an elliptical shape.

The display device 10 may include a display panel 100, a display driver 200, a circuit board 300 and a touch driver 400.

The display panel 100 may include a main area MA and a subsidiary area SBA.

The main area MA may include the display area DA including pixels for displaying images, and the non-display area NDA located around the display area DA (e.g., in the first and/or second directions X, Y). The display area DA may emit light from a plurality of emission areas or a plurality of opening areas to be described later. For example, in an embodiment the display panel 100 may include a pixel circuit including switching elements, a pixel-defining layer that defines the emission areas or the opening areas, and a self-light-emitting element.

For example, the self-light-emitting element may include, but is not necessarily limited to, at least one of: an organic light-emitting diode including an organic emissive layer, a quantum-dot light-emitting diode (quantum LED) including a quantum-dot emissive layer, an inorganic light-emitting diode (inorganic LED) including an inorganic semiconductor, and a micro light-emitting diode (micro LED). In the following drawings, it is illustrated that the self-luminous element is an organic light-emitting diode.

In an embodiment, the non-display area NDA may be disposed on the outer side of the display area DA (e.g., in the first and/or second directions X, Y). The non-display area NDA may be defined as the edge area of the main area MA of the display panel 100. In an embodiment, the non-display area NDA may include a gate driver that applies gate signals to gate lines, and fan-out lines that connect the display driver 200 with the display area DA.

The subsidiary area SBA may be extended from one side of the main area MA. For example, as shown in an embodiment of FIG. 2, the subsidiary area SBA may extend from a lower side of the main area MA in the second direction Y. However, embodiments of the present disclosure are not necessarily limited thereto. The subsidiary area SUB may include a flexible material that can be bent, folded, or rolled. For example, when the subsidiary area SBA is bent, the subsidiary area SBA may overlap the main area MA in the thickness direction (e.g., the third direction Z). The subsidiary area SBA may include pads connected to the display driver 200 and the circuit board 300. However, embodiments of the present disclosure are not necessarily limited thereto. For example, in an embodiment, the subsidiary area SBA may be eliminated, and the display driver 200 and the pads may be disposed in the non-display area NDA.

The display driver 200 may output signals and voltages for driving the display panel 100. The display driver 200 may supply data voltages to data lines. The display driver 200 may apply a supply voltage to a voltage line and may supply gate control signals to the gate driver. In an embodiment, the display driver 200 may be implemented as an integrated circuit (IC) and may be attached on the display panel 100 by a chip-on-glass (COG) technique, a chip-on-plastic (COP) technique, or ultrasonic bonding. For example, the display driver 200 may be disposed in the subsidiary area SBA and may overlap with the main area MA in the thickness direction as the subsidiary area SBA is bent. However, embodiments of the present disclosure are not necessarily limited thereto. For example, the display driver 200 may be mounted on the circuit board 300.

In an embodiment, the circuit board 300 may be attached on the pads of the display panel 100 using an anisotropic conductive film (ACF). Lead lines of the circuit board 300 may be electrically connected to the pads of the display panel 300. In an embodiment, the circuit board 300 may be a flexible printed circuit board (FPCB), a printed circuit board (PCB), or a flexible film such as a chip-on-film (COF).

The touch driver 400 may be mounted on the circuit board 300. The touch driver 400 may be connected to a touch sensing unit of the display panel 100. The touch driver 400 may supply a touch driving signal to a plurality of touch electrodes of the touch sensing unit and may sense a change in the capacitance between the plurality of touch electrodes. For example, the touch driving signal may be a pulse signal having a predetermined frequency. The touch driver 400 may determine whether there is an input and may find the coordinates of the input based on the amount of the change in the capacitance between the touch electrodes. The touch driver 400 may be implemented as an integrated circuit (IC).

Figure 3:
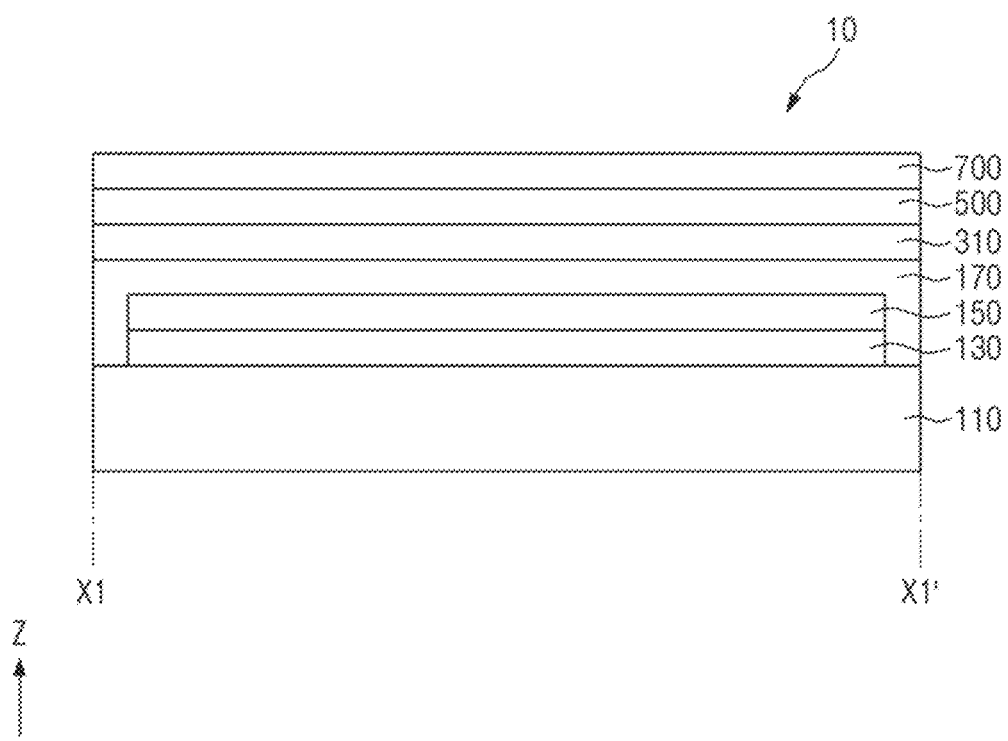
FIG. 3 is a cross-sectional view taken along line X1-X1' of FIG. 2.

FIG. 3 is a cross-sectional view showing an embodiment of the display panel, taken along line X1-X1' of FIG. 2.

Referring to FIG. 3, the display device 10 may include a substrate 110, a thin-film transistor 130, a light-emitting element layer 150, a thin-film encapsulation layer 170, a touch sensor layer 310, a polarizing film 500, and a cover window 700.

In an embodiment, the substrate 110 may be made of an insulating material such as a polymer resin. For example, the substrate SUB may be made of polyimide. The substrate SUB may be a flexible substrate that can be bent, folded, or rolled.

The thin-film transistor layer 130 may be disposed on the substrate 110. The thin-film transistor layer 130 may be disposed in the display panel 100 and the subsidiary area SBA, and may include thin-film transistors TFT.

Figure 9:
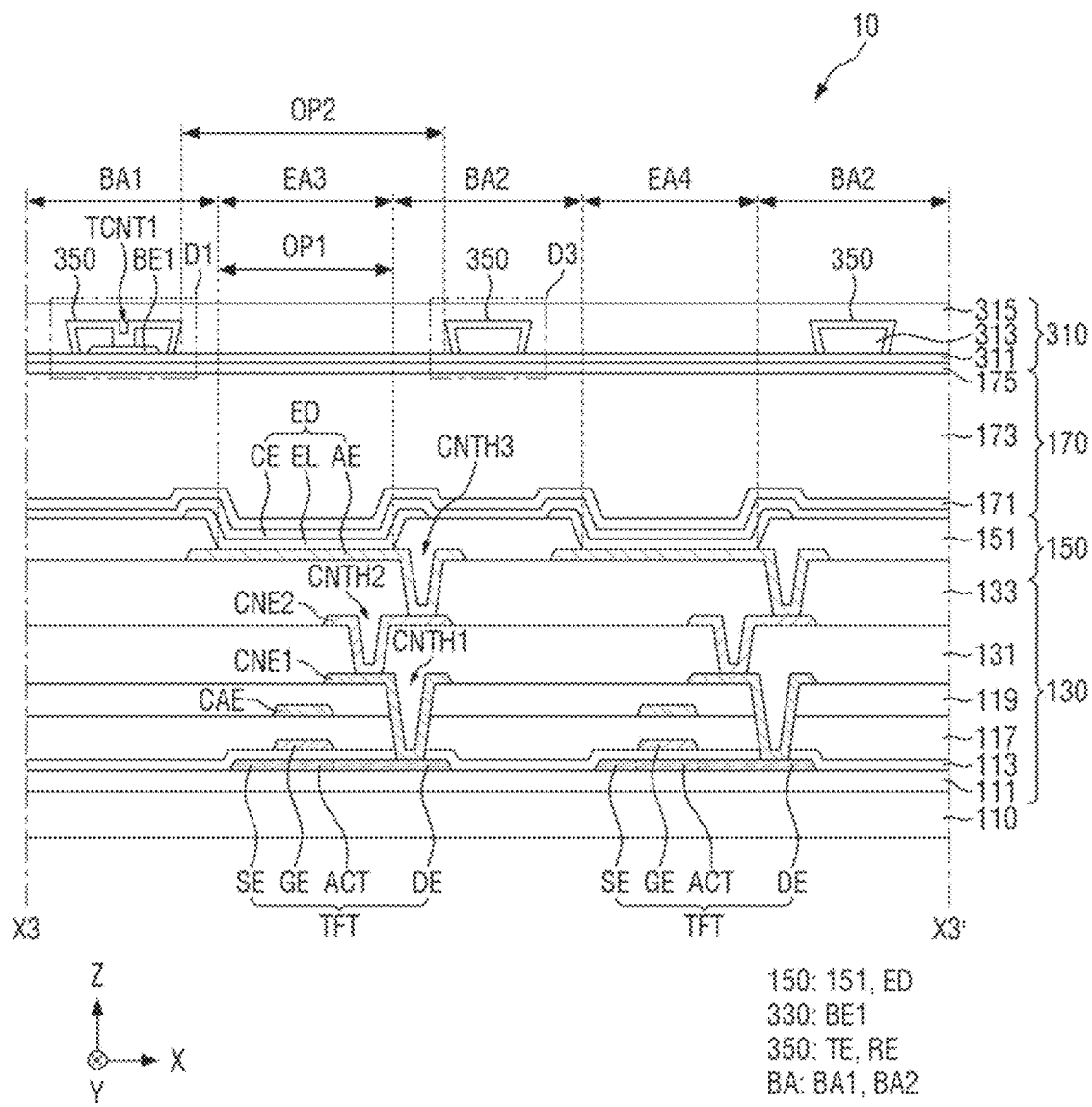
FIG. 9 is a cross-sectional view taken along line X3-X3' of FIG. 7.

In the thin-film transistor layer 130, the thin-film transistors TFT of the pixels as well as scan lines and data lines may be formed. As shown in FIG. 9, each of the thin-film transistors TFT may include a gate electrode GE, a semiconductor layer ACT, a source electrode SE, and a drain electrode DE.

The light-emitting element layer 150 may be disposed on the thin-film transistor layer 130. As shown in FIG. 9, the light-emitting element layer 150 may include light-emitting elements ED each including a pixel electrode AE, an emissive layer EL and a common electrode CE, and a pixel-defining layer 151 defining emission areas EA. In an embodiment, the emissive layer EL may be an organic emissive layer including an organic material. In this embodiment, the emissive layer may include a hole transporting layer, an organic light-emitting layer and an electron transporting layer.

When a voltage is applied to the pixel electrode AE and a cathode voltage is applied to the common electrode CE through a thin-film transistor TFT of the thin-film transistor layer 130, the holes and electrons move to the organic emissive layer through the hole transporting layer and the electron transporting layer, respectively, such that they combine in the organic emissive layer to emit light.

The thin-film encapsulation layer 170 may be disposed on the light-emitting element layer 150. The thin-film encapsulation layer 170 may be disposed to cover the thin-film transistor layer 130 and the light-emitting element layer 150.

In an embodiment, the thin-film encapsulation layer 170 may include at least one inorganic film to prevent permeation of oxygen or moisture into the light-emitting element layer 150. In an embodiment, the inorganic layer may be, but is not necessarily limited to, a silicon nitride layer, a silicon oxynitride layer, a silicon oxide layer, a titanium oxide layer, or an aluminum oxide layer. In addition, the thin-film encapsulation layer 170 may include at least one organic layer to protect the light-emitting element layer 150 from particles such as dust. The organic film may be formed of, but is not necessarily limited to, an acryl resin, an epoxy resin, a phenolic resin, a polyamide resin and a polyimide resin.

The touch sensor layer 310 may be disposed on the thin-film encapsulation layer 170. As the touch sensor layer 310 is disposed directly on the thin-film encapsulation layer 170, the thickness of the display device 10 can be reduced, compared with a display device in which a separate touch panel including the touch sensor layer 310 is attached on the thin-film encapsulation layer 170.

The touch sensor layer 310 may include touch electrodes for sensing a user's touch by capacitive sensing. For example, the touch sensor layer 310 may sense a user's touch using the touch electrodes by at least one of self-capacitance sensing and mutual capacitance sensing.

The polarizing film 500 may be disposed on the touch sensor layer 310 to prevent deterioration of visibility due to reflection of external light. In an embodiment, the polarizing film 500 may include a linear polarizer and a retardation film such as a λ/4 (quarter-wave) plate.

The cover window 700 is disposed on the polarization film 500. In an embodiment, the polarization film 500 and the cover window 700 may be attached together by an adhesive member such as an optically clear adhesive (OCA) film or an optically clear resin (OCR). However, embodiments of the present disclosure are not necessarily limited thereto.

Figure 4:
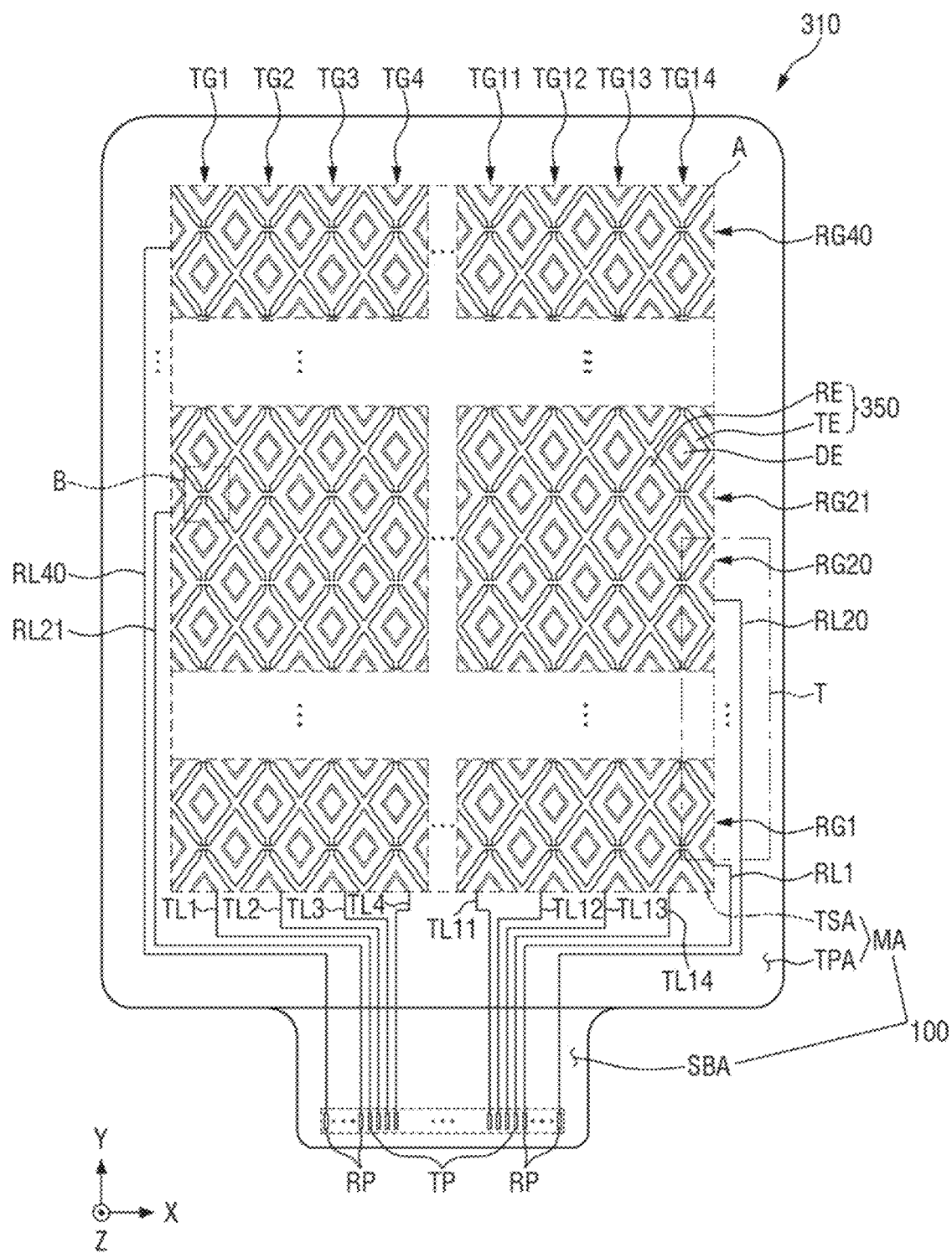
FIG. 4 is a plan view showing a touch sensor layer of a display device according to an embodiment of the present disclosure.

FIG. 4 is a plan view showing the touch sensor layer 310 of the display device according to an embodiment of the present disclosure.

Referring to FIG. 4, the touch sensor layer 310 includes a touch sensing area TSA for sensing a user's touch, and a touch peripheral area TPA disposed around the touch sensing area TSA (e.g., in the first and/or second directions X, Y). In an embodiment, the touch sensing area TSA may overlap the display area DA of FIGS. 1 to 3, and the touch peripheral area TPA may overlap the non-display area NDA of FIGS. 1 to 3.

As shown in FIGS. 4 to 9, the touch sensor layer 310 includes a touch buffer layer 311, first bridge electrodes BE1 included in the first conductive layer 330, a touch insulation layer 313, a plurality of driving electrode groups TG1 to TG14 and a plurality of sensing electrode groups RGI to RG40 included in the first conductive layer 330, a plurality of driving lines TL, a plurality of sensing lines RL, a plurality of driving Pads TP, and a plurality of sensing pads RP.

The plurality of driving electrode groups TG1 to TG14 and the plurality of sensing electrode groups RGI to RG40 may be disposed in the touch sensing area TSA. The plurality of driving lines TL1 to TL14, the plurality of sensing lines RL1 to RL40, the plurality of driving pads TP and the plurality of sensing pads RP may be disposed in the touch peripheral area TPA.

The driving electrode groups TG1 to TG14 may be arranged in a first direction (e.g., the x-axis direction). In an embodiment, the driving electrode groups TG1 to TG14 may be arranged from the left side to the right side of the touch sensing area TSA. For example, the first driving electrode group TG1 may be disposed on the leftmost position of the touch sensing area TSA, the second driving electrode group TG2 may be disposed on the right side of the first driving electrode group TG1, the third driving electrode group TG3 may be disposed to the right of the second driving electrode group TG2, and the fourth driving electrode group TG4 may be disposed to the right of the third driving electrode group TG3. In addition, the fourteenth driving electrode group TG14 may be disposed on the rightmost position of the touch sensing area TSA, the thirteenth driving electrode group TG13 may be disposed on the left side of the fourteenth driving electrode group TG14, the twelfth driving electrode group TG12 may be disposed to the left side of the thirteenth driving electrode group TG13, and the eleventh driving electrode group TG11 may be disposed to the left side of the twelfth driving electrode group TG12.

Figure 6:
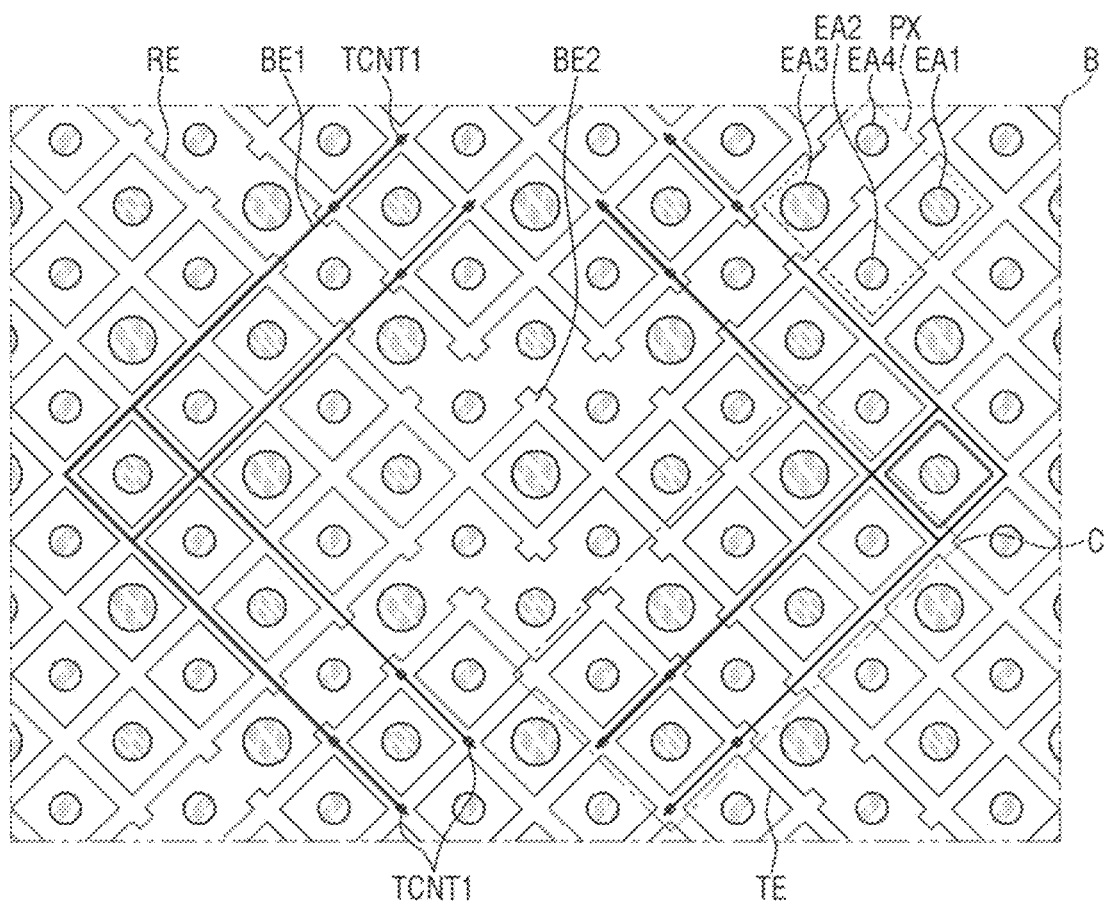
FIG. 6 is an enlarged plan view of area B of the touch sensing area of FIG. 4.

The driving electrode groups TG1 to TG14 may be electrically separated from one another. Each of the plurality of driving groups TG1 to TG7 includes a plurality of driving electrodes TE electrically connected with one another in a second direction (e.g., the y-axis direction). The driving electrodes TE adjacent to one another in the second direction (y-axis direction) may be connected with one another through first bridge electrodes BE1 included in the first conductive layer 330 as shown in FIG. 6.

In an embodiment, each of the plurality of driving electrode groups TG1 to TG14 may be connected to the respective driving line TL on one side (e.g., a first side) of the touch sensing area TSA in the second direction Y (e.g., the side where the plurality of driving pads TP and the plurality of sensing pads RP are located). For example, in an embodiment the first driving electrode group TG1 may be connected to the first driving line TL1, the second driving electrode group TG2 may be connected to the second driving line TL2, the third driving electrode group TG3 may be connected to the third driving line TL3, and the fourth driving electrode group TG4 may be connected to the fourth driving line TL4. The eleventh driving electrode group TG11 may be connected to the eleventh driving line TL11, the twelfth driving electrode group TG12 may be connected to the twelfth driving line TL12, the thirteenth driving electrode group TG13 may be connected to the thirteenth driving line TL13, and the fourteenth driving electrode group TG14 may be connected to the fourteenth driving line TL14.

In FIG. 4, the fifth to tenth driving electrode groups and the fifth to tenth driving lines are not depicted for the sake of clarity. In addition, although the touch sensing area TSA includes the fourteen driving electrode groups TG1 to TG14 and the fourteen driving lines TL1 to TL14 in FIG. 4, embodiments of the present disclosure are not necessarily limited thereto and the number of the driving electrode groups TG1 to TG14 and driving lines TI to TL14 may be greater than or less than fourteen.

The plurality of sensing electrode groups RGI to RG40 may be arranged in the second direction (e.g., the y-axis direction) The plurality of sensing electrode groups RGI to RG40 may be arranged from the lower side to the upper side of the touch sensing area TSA. For example, the first sensing electrode group RGI may be disposed on the lowermost position of the touch sensing area TSA (e.g, in the y-axis direction), and the fortieth sensing electrode group RG40 may be disposed on the uppermost position of the touch sensing area TSA.

The sensing electrode groups RGI to RG40 may be electrically separated from one another. Each of the plurality of sensing electrode groups RGI to RG40 includes a plurality of sensing electrodes RE electrically connected with one another in the first direction (e.g., the x-axis direction). The sensing electrodes RE adjacent to one another in the first direction (e.g., the x-axis direction) may be connected by second bridge electrodes BE2 as shown in FIG. 6. Unlike the first bridge electrodes BE1 included in the first conductive layer 330, the second bridge electrodes BE2 may be disposed in the same layer as the sensing electrodes RE included in the second conductive layer 350.

In an embodiment, each of the first to twentieth sensing electrode groups RGI to RG20 among the plurality of sensing electrode groups RGI to RG40 may be connected to the respective sensing line RL on the left side of the touch sensing area TSA. For example, the first sensing electrode group RGI may be connected to the first sensing line RL1, and the twentieth sensing electrode group RG20 may be connected to the twentieth sensing line RL20.

Each of the twenty-first to fortieth sensing electrode groups RG21 to RG40 among the plurality of sensing electrode groups RGI to RG40 may be connected to the respective sensing line RL on the right side of the touch sensing area TSA. For example, the twenty-first sensing electrode group RG21 may be connected to the twenty-first sensing line RL21, and the fortieth sensing electrode group RG40 may be connected to the fortieth sensing line RL40.

In FIG. 4, the second to nineteenth sensing electrode groups, the twenty-first to thirty-ninth sensing electrode groups, the second to nineteenth sensing lines, and the twenty-first to thirty-ninth sensing lines are not depicted for the sake of clarity. In addition, although the touch sensing area TSA includes the forty sensing electrode groups RGI to RG40 and the forty sensing lines RL1 to RL40 in FIG. 4, embodiments of the present disclosure are not necessarily limited thereto and the number of the sensing electrode groups RGI to RG40 and the number of the sensing lines RL1 to RL40 may be less than or greater than forty.

Each of a plurality of dummy electrodes DE may be surrounded by the driving electrode TE or the sensing electrode RE. Each of the plurality of dummy electrodes DE may be electrically separated from the driving electrode TE or the sensing electrode RE. Each of the plurality of dummy electrodes DE may be spaced apart from the driving electrode TE or the sensing electrode RE. For example, the dummy electrodes DE may be electrically floating.

In FIG. 4, the driving electrodes TE, the sensing electrodes RE and the dummy patterns DE each have a diamond shape when viewed from the top (e.g., in a plane defined in the first and second directions X, Y). However, embodiments of the present disclosure are not necessarily limited thereto. For example, each of the driving electrodes TE, the sensing electrodes RE and the dummy patterns DE may have another quadrangular shape than a diamond, other polygonal shapes than a quadrangular shape, a circle or an ellipse when viewed from the top (e.g., in a plane defined in the first and second directions X, Y).

In an embodiment, the plurality of driving lines TL1 to TL14 may be disposed on one side of the touch sensing area TSA in the second direction Y. For example, as shown in an embodiment of FIG. 4, the plurality of driving lines TL1 to TL14 may be disposed on a lower side of the touch sensing area TSA in the second direction Y. However, embodiments of the present disclosure are not necessarily limited thereto. A first portion of the sensing lines RL1 to RL40 may be disposed on the right side of the touch sensing area TSA (e.g., in the first direction X), and a remaining second portion of the sensing lines RL1 to RL40 may be disposed on the left side of the touch sensing area TSA (e.g., in the first direction X). For example, in an embodiment the first to twentieth sensing lines RL1 to RL20 may be disposed on the right side of the touch sensing area TSA (e.g., in the first direction X), and the twenty-first to fortieth sensing lines RL21 to RL40 may be disposed on the left side of the touch sensing area TSA (e.g., in the first direction X). The first to twentieth sensing lines RL1 to RL20 may be defined as a first sensing line group, and the twenty-first to fortieth sensing lines RL21 to RL40 may be defined as a second sensing line group.

In an embodiment, the length of one of the first to twentieth sensing lines RL1 to RL20 may be less than the length of one of the twenty-first to fortieth sensing lines RL21 to RL40. The minimum line length of the first to twentieth sensing lines RL1 to RL20 may be less than the minimum line length of the twenty-first to fortieth sensing lines RL21 to RL40.

Although FIG. 4 shows the number of sensing lines arranged on the right side of the touch sensing area TSA is equal to the number of sensing lines arranged on the left side of the touch sensing area TSA, embodiments of the present disclosure are not necessarily limited thereto. For example, the number of sensing lines arranged on the right side of the touch sensing area TSA may be different from the number of sensing lines arranged on the left side of the touch sensing area TSA. In an embodiment, the number of sensing lines arranged on the right side of the touch sensing area TSA may be greater than the number of sensing lines arranged on the left side of the touch sensing area TSA.

The driving pads TP may be connected to the driving lines, respectively. The sensing pads RP may be connected to the sensing lines, respectively. The driving pads TP and the sensing pads RP may be arranged in the subsidiary area SBA. In an embodiment, the driving pads TP and the sensing pads RP may be electrically connected to the display circuit board 300 through a conductive adhesive member such as an anisotropic conductive film.

Figure 5:
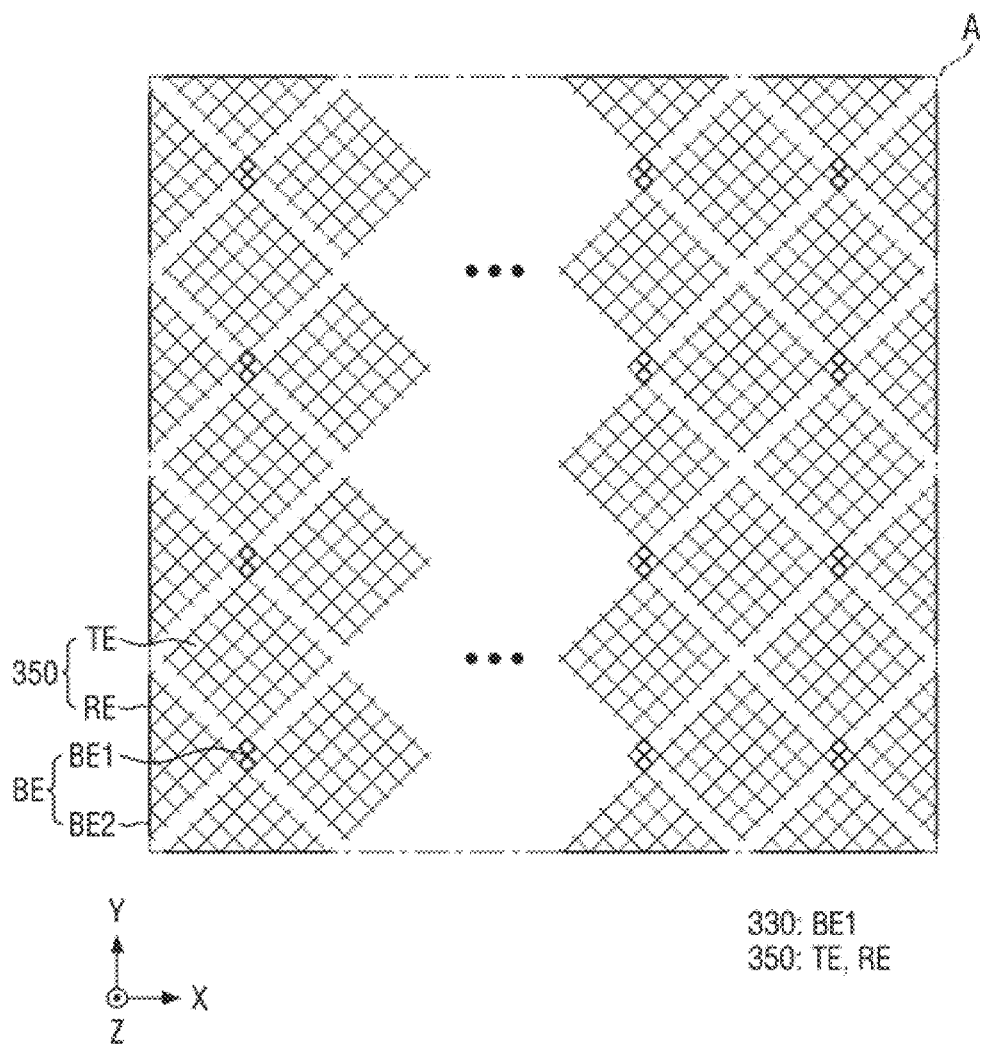
FIG. 5 is a plan view of area A of the touch sensor layer of FIG. 4.

FIG. 5 is an enlarged plan view of the touch sensor layer 310 in area A of FIG. 4.

As shown in an embodiment of FIG. 5, the first bridge electrodes BE1 included in the first conductive layer 330 to connect between the driving electrodes TE, the driving electrodes TE and the sensing electrodes RE included in the second conductive layer 350, and the second bridge electrodes BE2 formed in the same layer as the second conductive layer 350 to connect between the sensing electrodes RE may be formed as electrodes in a mesh pattern.

In an embodiment in which the touch sensor layer TSL is formed directly on the thin-film encapsulation layer 170 as shown in FIG. 3, the distance between the common electrode of the light-emitting element layer 150 and the driving electrodes TE or the sensing electrodes RE of the touch sensor layer TSL is relatively small. As a result, a very large parasitic capacitance may be formed between the common electrode of the light-emitting element layer 150 and the driving electrodes TE or the sensing electrodes RE of the touch sensor layer TSL. Therefore, it may be desired that the touch electrodes TE and the sensing electrodes RE are formed as electrodes in a mesh pattern to reduce this parasitic capacitance.

As each of the plurality of driving electrodes TE, the plurality of sensing electrodes RE, the plurality of first bridge electrodes BE1, the plurality of second bridge electrodes BE2 and the plurality of dummy electrodes DE is formed in a mesh pattern, each of the driving electrodes TE, the sensing electrodes RE, the first bridge electrodes BE1, the second bridge electrodes BE2 and the dummy electrodes DE may not overlap with the plurality of emission areas EA1, EA2, EA3 and EA4 of each of the pixels PX. Therefore, it is possible to prevent the luminance of the lights emitted from the emission areas EA1, EA2, EA3 and EA4 from being lowered, which may occur as the lights are blocked by the driving electrodes TE, the sensing electrodes RE, the first and second bridge electrodes BE1 and BE2, and the dummy patterns DE.

As mentioned earlier, in an embodiment the touch electrodes TE, the sensing electrodes RE and the second bridge electrode BE2 may be formed in the same layer, and the first bridge electrodes BE1 may be formed on a layer that is different from that of the touch electrodes TE and the sensing electrodes RE. In an embodiment, the touch electrodes TE, the sensing electrodes RE, the first bridge electrodes BE1 and the second bridge electrodes BE2 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. However, embodiments of the present disclosure are not necessarily limited thereto.

Figure 7:
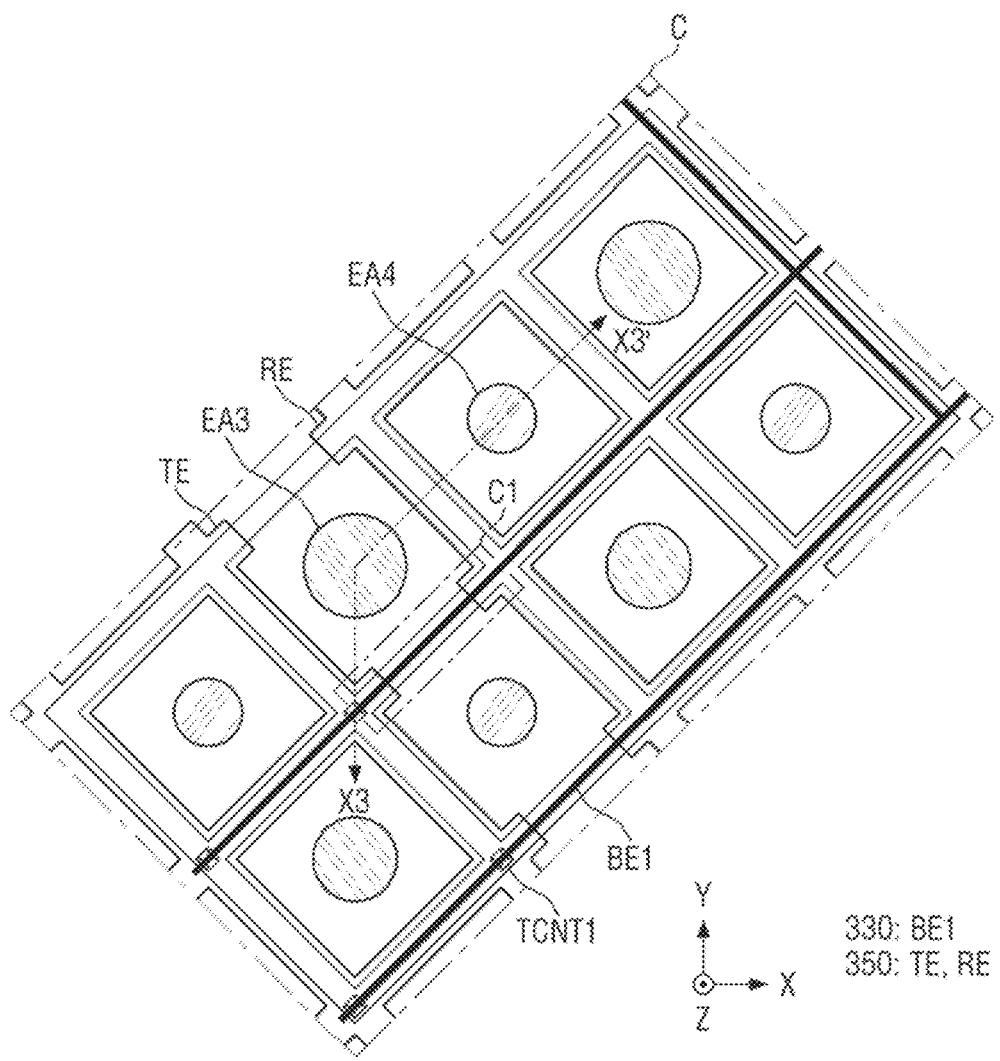
FIG. 7 is an enlarged plan view of area C of FIG. 6.
Figure 8:
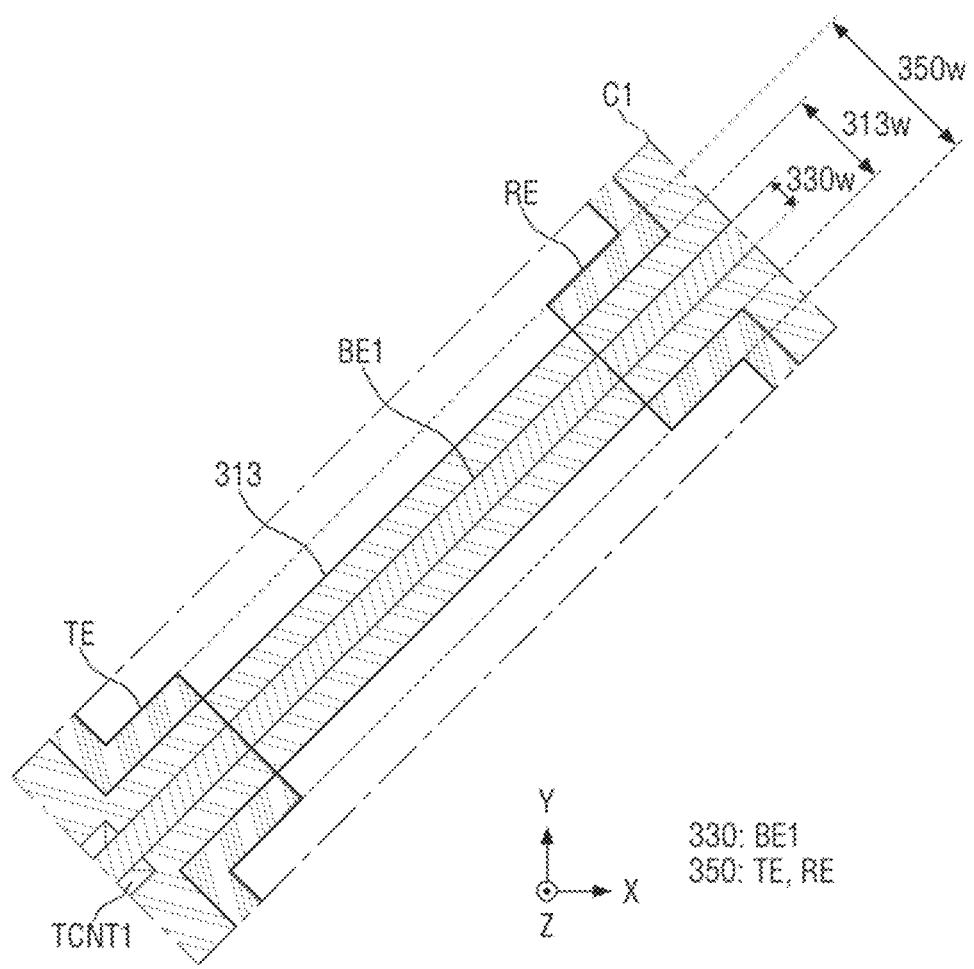
FIG. 8 is an enlarged plan view of area C1 of FIG. 7.

FIG. 6 is an enlarged plan view of area B of the touch sensing area TSA of FIG. 4. FIG. 7 is an enlarged plan view of area C of FIG. 6. FIG. 8 is an enlarged plan view of area C1 of FIG. 7.

Referring to FIGS. 6 and 7, the touch sensor layer 310 may include a plurality of driving electrodes TE and a plurality of sensing electrodes RE, and they may be disposed in the same layer and may be spaced apart from one another. In addition, the touch sensor layer 310 may include the first bridge electrodes BE1 disposed under the plurality of driving electrodes TE and the plurality of sensing electrodes RE, and the first bridge electrodes BE1 electrically connect between the driving electrodes TE. One side (e.g., a first side) of each of the first bridge electrodes BE1 may be connected to one of the driving electrodes TE adjacent to each other in the second direction Y through a touch contact hole TCNT1.

In addition, the touch sensor layer 310 may include the second bridge electrodes BE2 disposed in the same layer as the plurality of driving electrodes TE and the plurality of sensing electrodes RE, and the second bridge electrodes BE2 may electrically connect between the sensing electrodes TE.

A fourth direction DR4 and a fifth direction DR5 are additionally defined in FIG. 6. The fourth direction DR4 may refer to a direction between the first direction X and the second direction Y, and the fifth direction DR5 may refer to a direction between the opposite direction to the first direction X and the second direction Y. For example, in an embodiment, the fourth and fifth directions DR4, DR5 may be orthogonal to each other.

In an embodiment, each of the pixels PX includes a first emission area EA1 that emits light of a first color, a second emission area EA2 that emits light of a second color, a third emission area EA3 that emits light of a third color, and a fourth emission area EA4 that emits light of the second color For example, in an embodiment the first color may be red, the second color may be green, and the third color may be blue. However, embodiments of the present disclosure are not necessarily limited thereto.

In an embodiment, the first emission area EA1 and the second emission area EA2 of each of the pixels PX are adjacent to each other in the fourth direction DR4, and the third emission area EA3 and the fourth emission area EA4 may be adjacent to each other in the fourth direction DR4. The first emission area EA1 and the second emission area EA2 of each of the pixels PX are adjacent to each other in the fifth direction DR5, and the second emission area EA2 and the third emission area EA3 may be adjacent to each other in the fifth direction DR5.

In an embodiment, the pixel PX including the first emission area EA1, the second emission area EA2, the third emission area EA3 and the fourth emission area EA4 may emit white light.

Each of the first emission area EA1, the second emission area EA2, the third emission area EA3 and the fourth emission area EA4 may have, but is not necessarily limited to, a circular shape when viewed from the top (e.g., in a plane defined in the first and second directions X, Y). However, each of the first emission areas EA1, the second emission areas EA2, the third emission areas EA3 and the fourth emission areas EA4 may have any polygonal shape, a quadrangular shape or an elliptical shape other than the circular shape when viewed from the top. In addition, although the third emission area EA3 is the largest while the second emission area EA2 and the fourth emission area EA4 are the smallest in an embodiment shown in FIG. 6, embodiments of the present disclosure are not necessarily limited thereto.

As mentioned earlier, the first conductive layer 330 and the second conductive layer 350 may be formed in a mesh pattern or a net shape. In addition, the touch insulating layer 313 positioned between the first conductive layer 330 and the second conductive layer 350 may also be formed in a mesh pattern or net shape. For example, the touch insulating layer 313 formed in a mesh pattern may be disposed between the first conductive layer 330 and the second conductive layer 350 formed in a mesh pattern.

FIG. 8 is an enlarged plan view of area C1 of FIG. 7.

Referring to embodiments shown in FIGS. 7 and 8, the width 330$w$ of a first bridge electrode BE1 may be less than the width 313$w$ of the touch insulating layer 313, and the width 313$w$ of the touch insulating layer 313 may be less than the width 350$w$ of the second conductive layer 350. For example, the touch insulating layer 313 may cover the first bridge electrode BE1 included in the first conductive layer 330, and the second conductive layer 350 may cover the first bridge electrode BE1 and the touch insulating layer 313.

As described above, the first bridge electrode BE1 included in the first conductive layer 330 may be connected to the driving electrode TE disposed on a first side through the first touch contact hole TCNT1. The first bridge electrode BE1 may be connected to the driving electrode TE disposed on the opposite second side through the first touch contact hole TCNT1 where it overlaps with the sensing electrode RE. Accordingly, each of the plurality of first bridge electrodes BE1 may electrically connect between driving electrode TE adjacent to each other in the second direction Y.

FIG. 9 is a cross-sectional view taken along line X3-X3' of FIG. 7.

The cross-sectional structure of the display device 10 will be described with reference to FIG. 9.

The substrate 110 may be a base substrate or a base member. In an embodiment, the substrate 110 may be a flexible substrate that can be bent, folded, or rolled. For example, in an embodiment the substrate 110 may include, but is not necessarily limited to, a polymer resin such as polyimide PI. In an embodiment, the substrate 110 may include a glass material or a metal material.

The thin-film transistor layer 130 may include a buffer layer 111, a thin-film transistor TFT, a gate insulator 113, a first interlayer dielectric layer 117, a second interlayer dielectric layer 119, a first connection electrode CNE1, a first protective layer 131, a second connection electrode CNE2, and a second protective layer 133.

The buffer layer 111 may be disposed on the substrate 110. In an embodiment, the buffer layer 111 may include an inorganic film that can prevent the permeation of air or moisture. For example, the buffer layer 111 may include a plurality of inorganic films stacked on one another alternately (e.g., in the third direction Z).

The thin-film transistor TFT may be disposed on the buffer layer 111, and may form a pixel circuit of each of a plurality of pixels. For example, the thin-film transistor TFT may be a driving transistor or a switching transistor of the pixel circuit. In an embodiment, the thin-film transistor TFT may include a semiconductor layer ACT, a source electrode SE, a drain electrode DE and a gate electrode GE.

The semiconductor layer ACT may overlap the gate electrode GE in the thickness direction and may be insulated from the gate electrode GE by the gate insulator 113. The material of a portion of the semiconductor layer ACT may be made to be conductive to form the source electrode SE and the drain electrode DE.

The gate electrode GE may be disposed on the gate insulator 113 (e.g., disposed directly thereon in the third direction Z). The gate electrode GE may overlap the semiconductor layer ACT with the gate insulator 113 interposed therebetween (e.g., in the third direction Z).

The gate insulator 113 may be disposed on the semiconductor layer ACT (e.g., disposed directly thereon in the third direction Z). For example, the gate insulator 113 may cover the semiconductor layer ACT and the buffer layer 111, and may insulate the semiconductor layer ACT from the gate electrode GE.

The first interlayer dielectric layer 117 may cover the gate electrode GE and the gate insulator 113. The first interlayer dielectric layer 117 may include a first contact hole CNTH1 through which the first connection electrode CNE1 passes.

A capacitor electrode CAE may be disposed on the first interlayer dielectric layer 117 (e.g., disposed directly thereon in the third direction Z). The capacitor electrode CAE may overlap with the gate electrode GE of the thin-film transistor TFT in the third direction Z. Since the first interlayer dielectric layer 117 has a predetermined dielectric constant, a capacitor can be formed by the capacitor electrode CAE, the gate electrode GE, and the first interlayer dielectric layer 117 disposed between them. In an embodiment, the capacitor electrode CAE may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. However, embodiments of the present disclosure are not necessarily limited thereto.

The second interlayer dielectric layer 119 may cover the capacitor electrode CAE and the first interlayer dielectric layer 117. The second interlayer dielectric layer 119 may include a first contact hole CNTH1 through which the first connection electrode CNE1 passes. The first contact hole CNTH1 may be connected to the contact hole of the gate insulator 113 and the contact hole of the second interlayer dielectric layer 119.

The first connection electrode CNE1 may be disposed on the second interlayer dielectric layer 119 (e.g., disposed directly thereon in the third direction Z). The first connection electrode CNE1 may electrically connect the drain electrode DE of the thin-film transistor TFT with the second connection electrode CNE2. The first connection electrode CNE1 may be inserted into a contact hole formed in the second interlayer dielectric layer 119, the first interlayer dielectric layer 117 and the gate insulator GI to be in direct contact with the drain electrode DE of the thin-film transistor TFT.

The first passivation layer 131 may cover the first connection electrode CNE1 and the second interlayer dielectric layer 119. The first passivation layer 131 can protect the thin-film transistor TFT. The first protective layer 131 may include a second contact hole CNTH2 through which the second connection electrode CNE2 passes.

The second connection electrode CNE2 may be disposed on the first protective layer 131 (e.g., disposed directly thereon in the third direction Z). The second connection electrode CNE2 may electrically connect the first connection electrode CNE1 with a pixel electrode AE of a light-emitting element ED. The second connection electrode CNE2 may be brought into direct contact with the first connection electrode CNE1 through the second contact hole CNTH2 formed in the first protective layer 131.

The second protective layer 133 may cover the second connection electrode CNE2 and the first protective layer 131. The second protective layer 133 may include a third contact hole CNTH3 through which the pixel electrode AE of the light-emitting element ED passes.

The light-emitting element layer 150 may be disposed on the thin-film transistor layer 130. The light-emitting element layer 150 may include a light-emitting element ED and a pixel-defining layer 151. In an embodiment, the light-emitting element ED may include the anode electrode AE, an emissive layer EL, and a common electrode CE.

The pixel electrode AE may be disposed on the second protective layer 133 (e.g., disposed directly thereon in the third direction Z). The pixel electrode AE may be disposed such that it overlaps (e.g., in the third direction Z) with one of openings defined by the pixel-defining layer 151. The pixel electrode AE may be electrically connected to the drain electrode DE of the thin-film transistor TFT through the first and second connection electrodes CNE1 and CNE2.

The plurality of pixel-defining layers 151 positioned in the first direction may define first openings OP1, and the pixel-defining layer 151 may be partially disposed on (e.g., partially in direct contact with) the second protective layer 133 and the pixel electrode AE. The first opening OP1 may expose a portion of the pixel electrode AE. As described above, the first openings OP1 of the pixel-defining layer 151 may define the first to fourth emission areas EA1, EA2, EA3 and EA4, respectively, and may have different areas or sizes from each other in some embodiments.

For example, the area defined by the first opening OP1 may be defined as the emission area EA, and each of the plurality of pixels PX may include the first to fourth emission areas EA1, EA2, EA3 and EA4. FIG. 9 is a cross-sectional view taken along line X3-X3' of FIG. 7, which may include a third emission area EA3 and a fourth emission area EA4.

The pixel-defining layer 151 may separate and insulate the pixel electrode AE of one of the plurality of light-emitting elements ED from the pixel electrode of another one of the light-emitting diodes ED. The pixel-defining layer PDL may include a light-absorbing material to prevent light reflection. The areas overlapping with the plurality of pixel-defining layers 151 and excluding the emission areas EA may be defined as non-emission areas BA.

In some embodiments, the pixel-defining layer 151 may include a polyimide (PI)-based binder and a mixture of red, green and blue pigments, or may include a cardo-based binder resin, a mixture of lactam black pigment and blue pigment, and carbon black. However, embodiments of the present disclosure are not necessarily limited thereto.

In an embodiment, the emissive layer EL may be an organic emissive layer made of an organic material. In an embodiment in which the emissive layer EL is an organic emissive layer, the thin-film transistor applies a predetermined voltage to the pixel electrode AE of the light-emitting diode ED and the common electrode CE of the light-emitting diode ED receives a common voltage or cathode voltage, the holes and electrons may move to the emissive layer EL through the hole transporting layer and the electron transporting layer, respectively, and they combine in the emissive layer EL to emit light.

The common electrode CE may be disposed on the emissive layer EL and the pixel-defining film 151. In addition, in an embodiment the common electrode CE may be formed on the entire surface of the display area DA in the form of an electrode common to all pixels without being disposed separately in a plurality of pixels. However, embodiments of the present disclosure are not necessarily limited thereto.

The common electrode CE may receive a common voltage or a low-level voltage. In an embodiment in which the pixel electrode AE receives the voltage equal to the data voltage and the common electrode CAT receives the low-level voltage, a potential difference is formed between the pixel electrode AE and the common electrode CE, so that the emissive layer EL can emit light.

The thin-film encapsulation layer 170 may be disposed on the common electrode CE to cover the light-emitting elements ED. In some embodiments, the thin-film encapsulation layer 170 may include at least one inorganic film and at least one organic film to prevent permeation of particles such as oxygen, moisture and dust into the light-emitting element layer 150.

In an embodiment as shown in FIG. 9, the thin-film encapsulation layer 170 may include a first thin-film encapsulation layer 171, a second thin-film encapsulation layer 173, and a third thin-film encapsulation layer 175 sequentially stacked on one another in the third direction Z. The first thin-film encapsulation layer 171 and the third thin-film encapsulation layer 175 may be inorganic layers, and the second thin-film encapsulation layer 173 disposed between them may be an organic layer.

Each of the first thin-film encapsulation layer 171 and the third thin-film encapsulation layer 175 may include one or more inorganic insulating materials. In an embodiment, the inorganic insulating material may include aluminum oxide, titanium oxide, tantalum oxide, hafnium oxide, zinc oxide, silicon oxide, silicon nitride, and/or silicon oxynitride. However, embodiments of the present disclosure are not necessarily limited thereto.

The second thin-film encapsulation layer 173 may include a polymer-based material. In an embodiment, the polymer-based material may include an acrylic resin, an epoxy resin, polyimide, polyethylene, etc. For example, an organic encapsulation layer 320 may include an acrylic resin, such as polymethyl methacrylate and polyacrylic acid. The second thin-film encapsulation layer 173 may be formed by curing a monomer or by applying a polymer. However, embodiments of the present disclosure are not necessarily limited thereto.

The touch sensor layer 310 may be disposed on the third thin-film encapsulation layer 175 (e.g., disposed directly thereon in the third direction Z). As mentioned earlier, the touch sensor layer 310 may include the touch buffer layer 311, the first conductive layer 330, the touch insulating layer 313, the second conductive layer 350, and a touch protection layer 315.

In an embodiment, the touch buffer layer 311 may be formed of an inorganic layer, for example, a silicon nitride layer, a silicon oxynitride layer, a silicon oxide layer, a titanium oxide layer, or an aluminum oxide layer. However, embodiments of the present disclosure are not necessarily limited thereto. The touch buffer layer 311 may be disposed between the thin-film encapsulation layer 170 and the touch insulating layer 313 (e.g., in the third direction Z).

As mentioned earlier, the areas overlapping the pixel-defining layers 151 and excluding the emission areas EA may be defined as non-emission areas BA, which may include a first area BA1 and a second area BA2. The first area BA1 and the second area BA2 may be spaced apart from each other.

Figure 10:
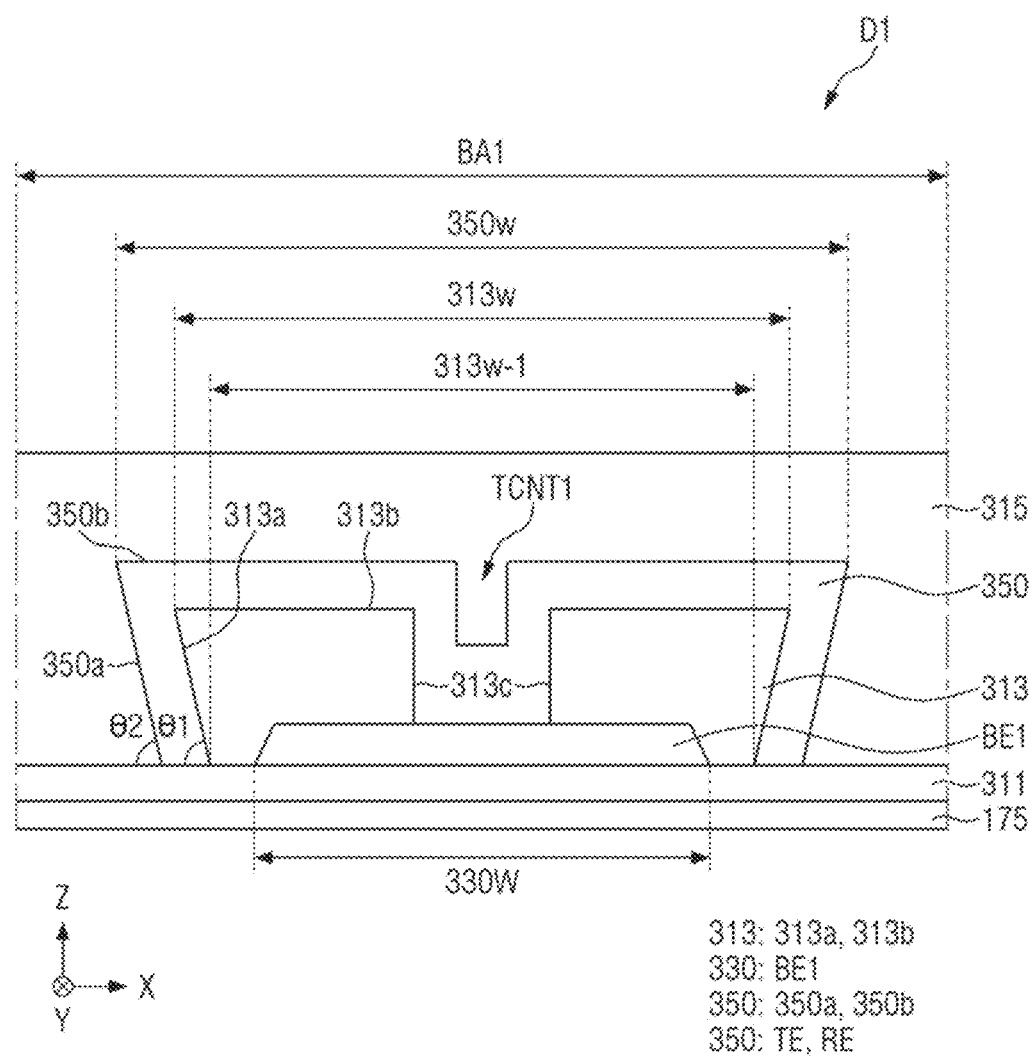
FIG. 10 is an enlarged cross-sectional view of area DI of FIG. 9.
Figure 11:
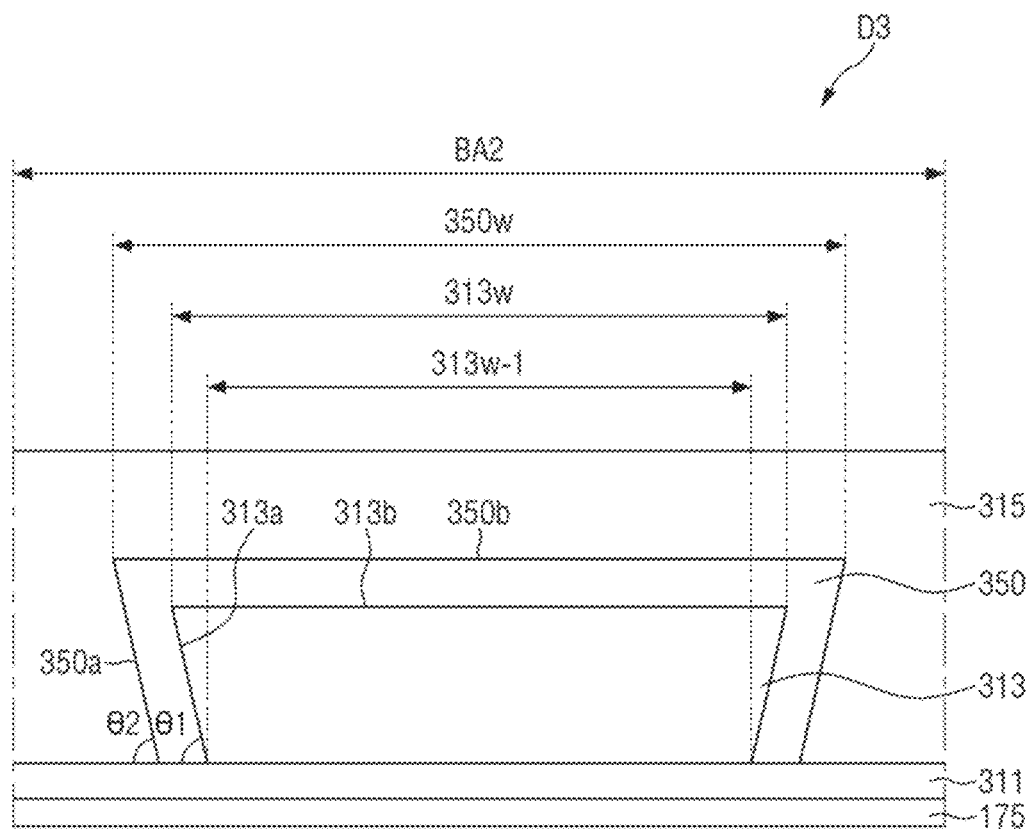
FIG. 11 is an enlarged cross-sectional view of area D3 of FIG. 9.

As disclosed in FIGS. 9 to 11, in the first area BA1, a first bridge electrode BE1 may be disposed on the touch buffer layer 311, the touch insulating layer 313 may be disposed on the first bridge electrode BE1, and a second conductive layer 350 may be disposed on the touch insulating layer 313. In an embodiment, a first bridge electrode BE1 is not disposed in the second area BA2, the touch insulating layer 313 may be disposed directly on the touch buffer layer 311, and the second conductive layer 350 may be disposed on the touch insulating layer 313.

In some embodiments, the second conductive layer 350 in the first area BA1 may include a driving electrode TE, and the second conductive layer 350 in the second area BA2 may include a sensing electrode RE. However, embodiments of the present disclosure are not necessarily limited thereto.

In some embodiments, the first bridge electrode BE1 included in the first conductive layer 330 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. For example, the first conductive layer 330 made up of multiple layers may be formed in a structure of titanium (Ti)/aluminum (Al)/titanium (Ti). However, embodiments of the present disclosure are not necessarily limited thereto.

The touch insulating layer 313 may be disposed on (e.g., disposed directly thereon) the first bridge electrode BE1. For example, in an embodiment, the touch insulating layer 313 may directly contact portions of the top surface of the first bridge electrode BE1 and both lateral ends of the first bridge electrode BE1. In an embodiment, the touch insulating layer 313 may be formed of an inorganic layer, for example, a silicon nitride layer, a silicon oxynitride layer, a silicon oxide layer, a titanium oxide layer, or an aluminum oxide layer. Alternatively, the touch insulating layer 313 may be formed of an organic layer such as an acryl resin, an epoxy resin, a phenolic resin, a polyamide resin and a polyimide resin.

The second conductive layer 350 may be disposed on the touch insulating layer 313 (e.g., disposed directly thereon), and the second conductive layer 350 may include driving electrodes TE and sensing electrodes RE. In addition, the dummy electrodes DE, the first driving line TL1, the second driving line TL2 and the sensing lines RL shown in FIG. 4 may be formed in the same layer as the second conductive layer 350, and may be disposed on the touch insulating layer 313.

In some embodiments, the touch insulating layer 313 may be formed to overlap with the non-emission areas BA and the pixel-defining layer 151 but not with the emission areas EA, and may include second openings OP2 spaced apart from one another in the first direction and defined by the touch insulating layer 313. For example, each of the touch insulating layers 313 forming the second openings OP2 and spaced apart from one another may have an island shape. In an embodiment the second conductive layer 350 of the display device 10 may be made up of a single layer of one of molybdenum (Mo), aluminum (Al), chromium (Cr), gold (Au), titanium (Ti), nickel (Ni), neodymium (Nd) and copper (Cu) or an alloy thereof. However, embodiments of the present disclosure are not necessarily limited thereto.

FIG. 10 is an enlarged, cross-sectional view of area DI of FIG. 9.

The first area BA1 will be described with reference to FIG. 10. As described above, the width $330w$ (e.g., length in the first direction X) of the first bridge electrode BE1 included in the first conductive layer 330 may be less than the width $330w$ (e.g., length in the first direction X) of the touch insulating layer 313.

In some embodiments, the touch insulating layer 313 may cover the both ends of the first conductive layer 330 in the first direction X, and may include one surface (e.g, a first surface) in direct contact with the first conductive layer 330 and the touch buffer layer 311, a flat surface 313b facing the first surface in direct contact with the first conductive layer 330 and the touch buffer layer 311, and an inclined surface 313a connecting the first surface with the flat surface 313b. The first surface of the touch insulating layer 313 may face the thin-film encapsulation layer 170.

In some embodiments as shown in FIG. 10, the width 313w-1 of the first surface of the touch insulating layer 313 in direct contact with the first conductive layer 330 and the touch buffer layer 311 in the first direction X may be less than the width 313w of the flat surface 313b.

In some embodiments, a first angle θ1 defined by the touch buffer layer 311 and the inclined surface 313a of the touch insulating layer 313 may be an acute angle where the inclined surface 313a of the touch insulating layer 313 is in direct contact with the second conductive layer 350.

For example, the touch insulating layer 313 may have a reverse tapered shape in which the width 313w of the flat surface 313b is greater than the width 313w-1 of the first surface in direct contact with the first conductive layer 330 and the touch buffer layer 311, and the first angle θ1 is an acute angle.

In some embodiments, the second conductive layer 350 may be disposed on the touch insulating layer 313 (e.g., disposed directly thereon). For example, in an embodiment the second conductive layer 350 may extend along and directly contacts the inclined surface 313a and the flat surface 313b of the touch insulating layer 313 to cover them.

In some embodiments, the second conductive layer 350 may include a flat surface 350b and an inclined surface 350a which cover the flat surface 313b and the inclined surface 313a of the touch insulating layer 313, respectively. The flat surface 350b and the inclined surface 350a of the second conductive layer 350 may have a reverse tapered shape like the touch insulating layer 313. The second conductive layer 350 may also include a first surface that faces the thin-film encapsulation layer 170. As shown in an embodiment of FIG. 10, the first surface of the second conductive layer 350 in the first area BA1 directly contacts the first bridge electrode BE1 and the touch buffer layer 311. The flat surface 350b may be a second surface that is opposite to the first surface. The second surface of the second conductive layer 350 may have a width (e.g., length in the first direction X) that is greater than a width (e.g, length in the first direction X) of the first surface of the second conductive layer 350.

For example, in an embodiment the width 350w (e.g., length in the first direction X) of the second conductive layer 350 may be greater than the width 330w (e.g., length in the first direction X) of the first conductive layer 330 and the width 313w of the touch insulating layer 313, and thus the second conductive layer 350 may completely cover the first conductive layer 330 and the touch insulating layer 313.

In some embodiments, a second angle θ2 defined by the touch buffer layer 311 and the inclined surface 350a of the second conductive layer 350 may be an acute angle where the inclined surface 350a of the second conductive layer 350 are in direct contact with the touch protective layer 315.

For example, the second conductive layer 350 may completely cover the touch insulating layer 313 and have a reverse taper shape.

As shown in FIG. 10, in the first area BA1, a first touch contact hole TCNT1 may be formed through the center of the touch insulating layer 313, and the first bridge electrode BE1 of the first conductive layer 330 and the driving electrode TE of the second conductive layer 350 may be connected to each other through the first touch contact hole TCNT1.

The opposite surface 313c of the touch insulating layer 313 that is opposed to the inclined surface 313a (e.g., in the first direction X) is formed by the first touch contact hole TCNT1 in the first area BA1. The opposite surface 313c of the touch insulating layer 313 may be spaced apart from the inclined surface 313a (e.g., in the first direction X) by the first touch contact hole TCNT1 to face it.

In some embodiments, the touch insulating layer 313 may cover the first conductive layer 330 and may be formed in a reverse taper shape, and the second conductive layer 350 may completely cover the touch insulating layer 313 in the reverse tapered shape. The display device 10 including the touch insulating layer 313 and the second conductive layer 350 in the reverse tapered shape can reduce the issue of deterioration of visibility due to reflection of external light by the metal included in the second conductive layer 350 from outside the display device 10.

In some embodiments, the touch protective layer 315 may be disposed on the second conductive layer 350 such that it overlaps with the non-emission areas BA and the emission areas EA. The touch protective layer 315 may provide a flat surface over the level differences formed by the first conductive layer 330, the second conductive layer 350 and the touch insulating layer 313.

In an embodiment, the touch protective layer 315 may be formed of an organic layer such as an acryl resin, an epoxy resin, a phenolic resin, a polyamide resin and a polyimide resin. However, embodiments of the present disclosure are not necessarily limited thereto.

FIG. 11 is an enlarged, cross-sectional view of area D3 of FIG. 9.

In some embodiments, the second area BA2 may be different from the first area BA1 in that an entirety of the first surface of the touch insulating layer 313 is disposed directly on the touch buffer layer 311 and the first bridge electrode BE1 is not included in the second area BA2. The second conductive layer 350 may be disposed directly on the touch insulating layer 313. In an embodiment, the second conductive layer 350 of the second area BA2 may be, but is not necessarily limited to, the sensing electrodes RE.

In some embodiments, the width 350w (e.g., length in the first direction X) of the second conductive layer 350 may be greater than the width 313w (e.g., length in the first direction X) of the touch insulating layer 313. Like the touch insulating layer 313 in the first area BA1, the touch insulating layer 313 in the second area BA2 may include a first surface in direct contact with the touch buffer layer 311, a flat surface 313b facing the first surface and in direct contact with the touch insulating layer 311, and an inclined surface 313a connecting the first surface with the flat surface 313b.

The width 313w-1 (e.g., length in the first direction X) of the first surface of the touch insulating layer 313 in direct contact with the touch buffer layer 311 may be less than the width 313w of the flat surface 313b. For example, the touch insulating layer 313 may have a reverse tapered shape in which the width 313w of the flat surface 313b is greater than the width 313w of the first surface of the touch insulating layer 313 in direct contact with the touch buffer layer 311.

The second conductive layer 350 may be disposed on (e.g., disposed directly thereon) the touch insulating layer 313. The second conductive layer 350 may be disposed on the inclined surface 313a and the flat surface 313b of the touch insulating layer 313 to cover them. The width 350w (e.g., length in the first direction X) of the second conductive layer 350 may be greater than the width 330w of the first conductive layer 330 and the width 313w of the touch insulating layer 313. Accordingly, the second conductive layer 350 may cover the first conductive layer 330 and the touch insulating layer 313.

In some embodiments, since the second conductive layer 350 covers the touch insulating layer 313, the second conductive layer may include the flat surface 350b and the inclined surface 350a and may have a reverse tapered shape like the touch insulating layer 313.

In some embodiments, a first angle θ1 defined by the touch buffer layer 311 and the inclined surface 313a may be an acute angle where the inclined surface 313a of the touch insulating layer 313 is in direct contact with the second conductive layer 350.

In some embodiments, the touch protective layer 315 may be disposed on the second conductive layer 350 such that it overlaps with the non-emission areas BA and the emission areas EA, and a second angle θ2 defined by the touch buffer layer 311 and the inclined surface 350a of the second conductive layer 350 may be an acute angle where the second conductive layer 350 is in direct contact with the touch protective layer 315.

In some embodiments, the second conductive layer 350 may be, but is not necessarily limited to, the sensing electrodes RE. The second conductive layer 350 may be made up of a single layer one of molybdenum (Mo), aluminum (Al), chromium (Cr), gold (Au), titanium (Ti), nickel (Ni), neodymium (Nd) and copper (Cu) or an alloy thereof. However, embodiments of the present disclosure are not necessarily limited thereto.

The other elements have been described above and will not be described to avoid redundancy.

Figure 12:
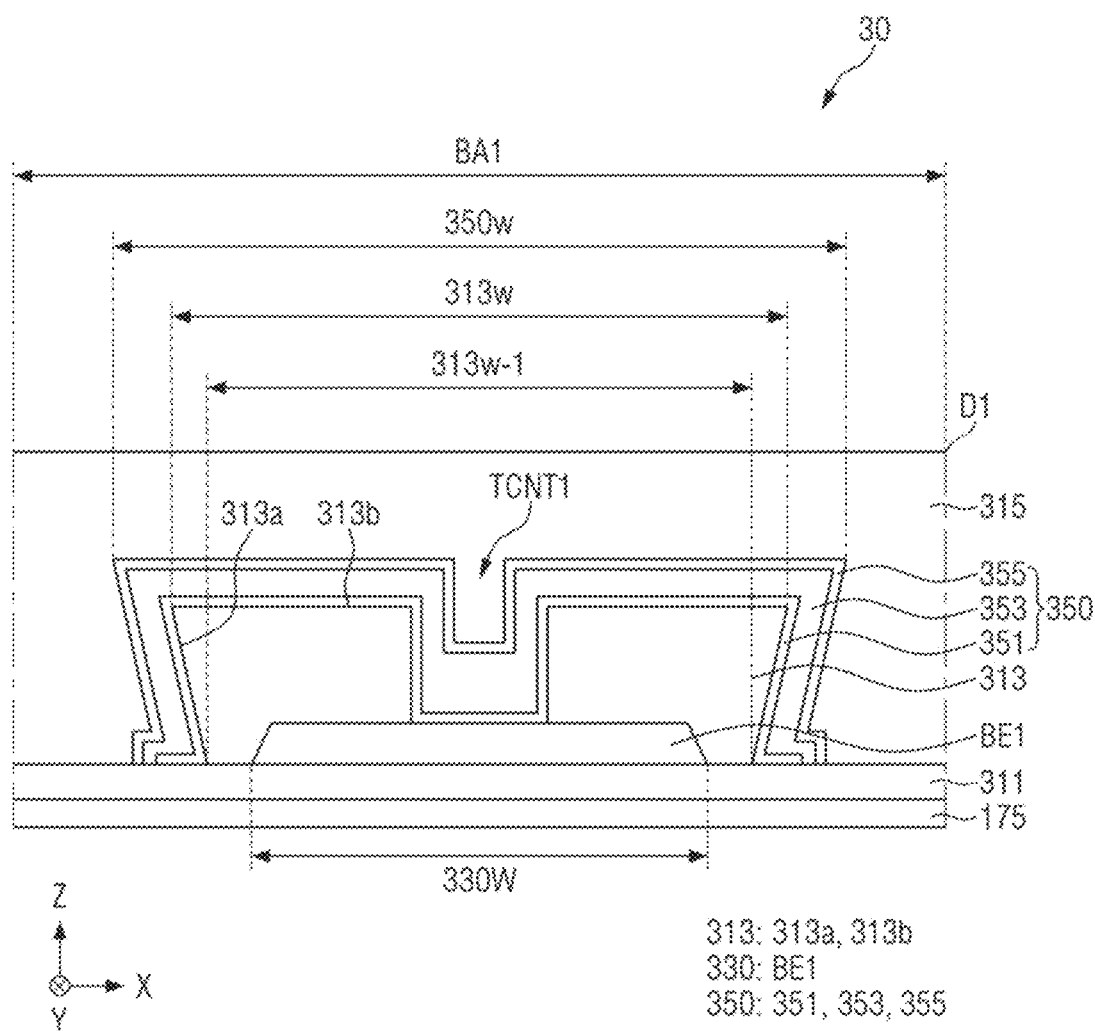
FIG. 12 is an enlarged cross-sectional view of area DI of FIG. 9 according to another embodiment.
Figure 13:
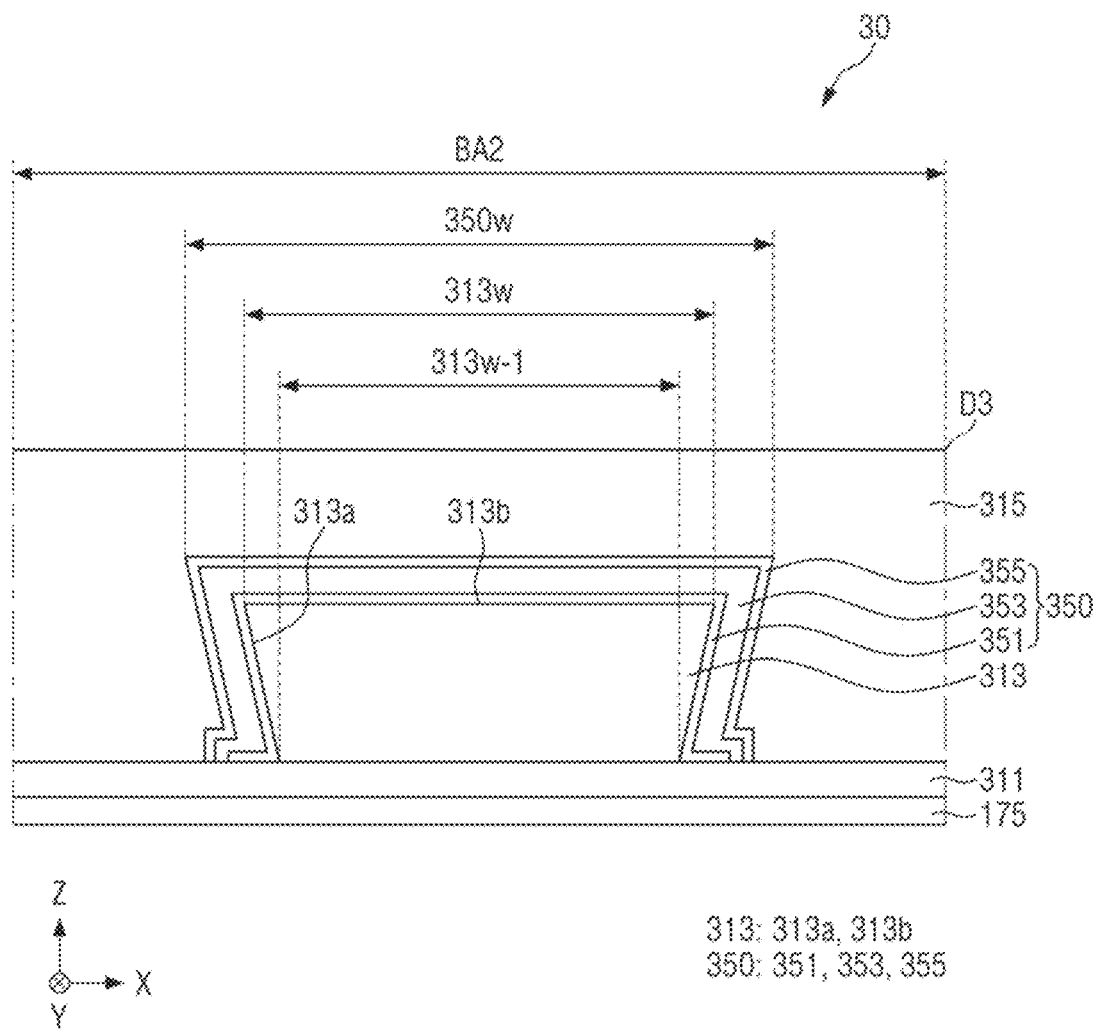
FIG. 13 is an enlarged cross-sectional view of area D3 of FIG. 9 according to another embodiment.

FIG. 12 is an enlarged cross-sectional view of area DI of FIG. 9 according to an embodiment. FIG. 13 is an enlarged cross-sectional view of area D3 of FIG. 9 according to an embodiment.

A display device according to embodiments of FIGS. 12 and 13 are different from the display device 10 of FIGS. 9 to 11 in that a second conductive layer 350 includes a first metal layer 351, a second metal layer 353, and a third metal layer 355.

Referring to FIG. 13, in the first area BA1, the first metal layer 351 may be disposed directly on the touch insulating layer 313 and the first conductive layer 330 to cover them. The second metal layer 353 may be disposed along the first metal layer 351. A first surface of the third metal layer 355 may be in direct contact with the second metal layer 353, and the opposite second surface of the third metal layer 355 may be disposed in direct contact with the touch protective layer 315.

Referring to FIG. 12, in the second area BA2, a first surface of the first metal layer 351 may be disposed on the touch insulating layer 313 to cover the touch insulating layer 313. The second metal layer 353 may be disposed in direct contact with the first metal layer. A first surface of the third metal layer 355 may be disposed in contact with the second metal layer 353 and the opposite second surface of the third metal layer 355 may be disposed in direct contact with the touch protective layer 315.

While the second conductive layer 350 of the display device 10 may be made up of a single layer of one of: molybdenum (Mo), aluminum (Al), chromium (Cr), gold (Au), titanium (Ti), nickel (Ni), neodymium (Nd) and copper (Cu) or an alloy thereof, the second conductive layer 350 of the display device 30 may be made up of multiple layers of one of: molybdenum (Mo), aluminum (Al), chromium (Cr), gold (Au), titanium (Ti), nickel (Ni), neodymium (Nd) and copper (Cu) or an alloy thereof. However, embodiments of the present disclosure are not necessarily limited thereto.

In some embodiments, the first metal layer 351 and the third metal layer 355 of the display device 30 may include titanium (Ti), and the second metal layer 353 may include aluminum (Al). It should be understood, however, that embodiments of the present disclosure are not necessarily limited thereto.

In some embodiments, the third metal layer 355 may be disposed on the second metal layer 353 and may completely cover the first metal layer 351 and the second metal layer 353. In addition, the reflectance of the first metal layer 351 and the third metal layer 355 may be lower than that of the second metal layer 353. For example, in an embodiment the second conductive layer 350 may have a three-layer structure of titanium/aluminum/titanium.

The first conductive layer 330 of the display device 10 and the first conductive layer 330 of the display device 30 may or may not have the same structure as each other.

In some embodiments, the touch insulating layer 313 and the second conductive layer 350 of the display device 30 may be formed in a reverse tapered shape like in the display device 10. The width 350w (e.g., length in the first direction X) of the second conductive layer 350 may be greater than the width 313w (e.g., length in the first direction X) of the touch insulating layer 313, and the width 313w of the touch insulating layer 313 may be greater than the width 330w (e.g., length in the first direction X) of the first conductive layer 330.

The other elements have been described above and will not be described to avoid redundancy.

Figure 14:
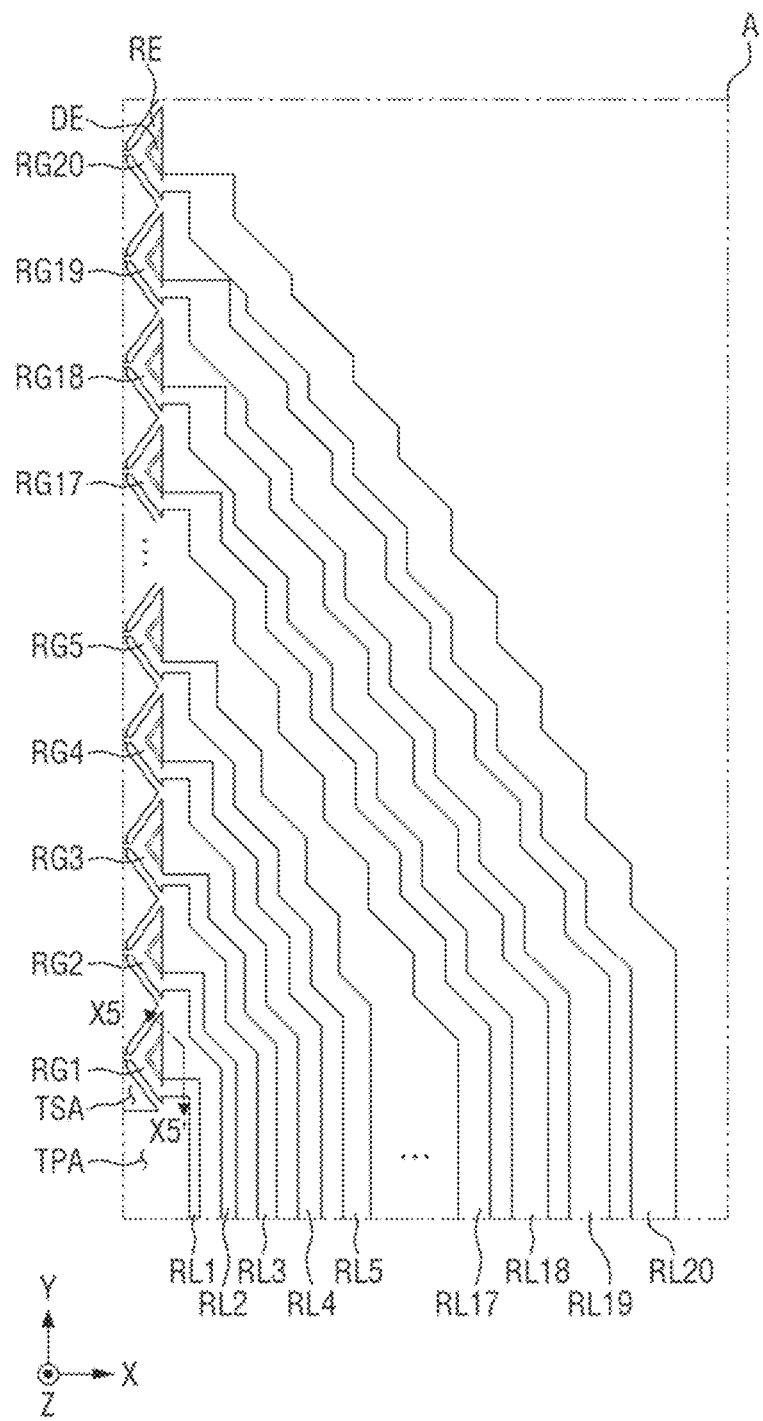
FIG. 14 is an enlarged plan view of area T of FIG. 4.
Figure 15:
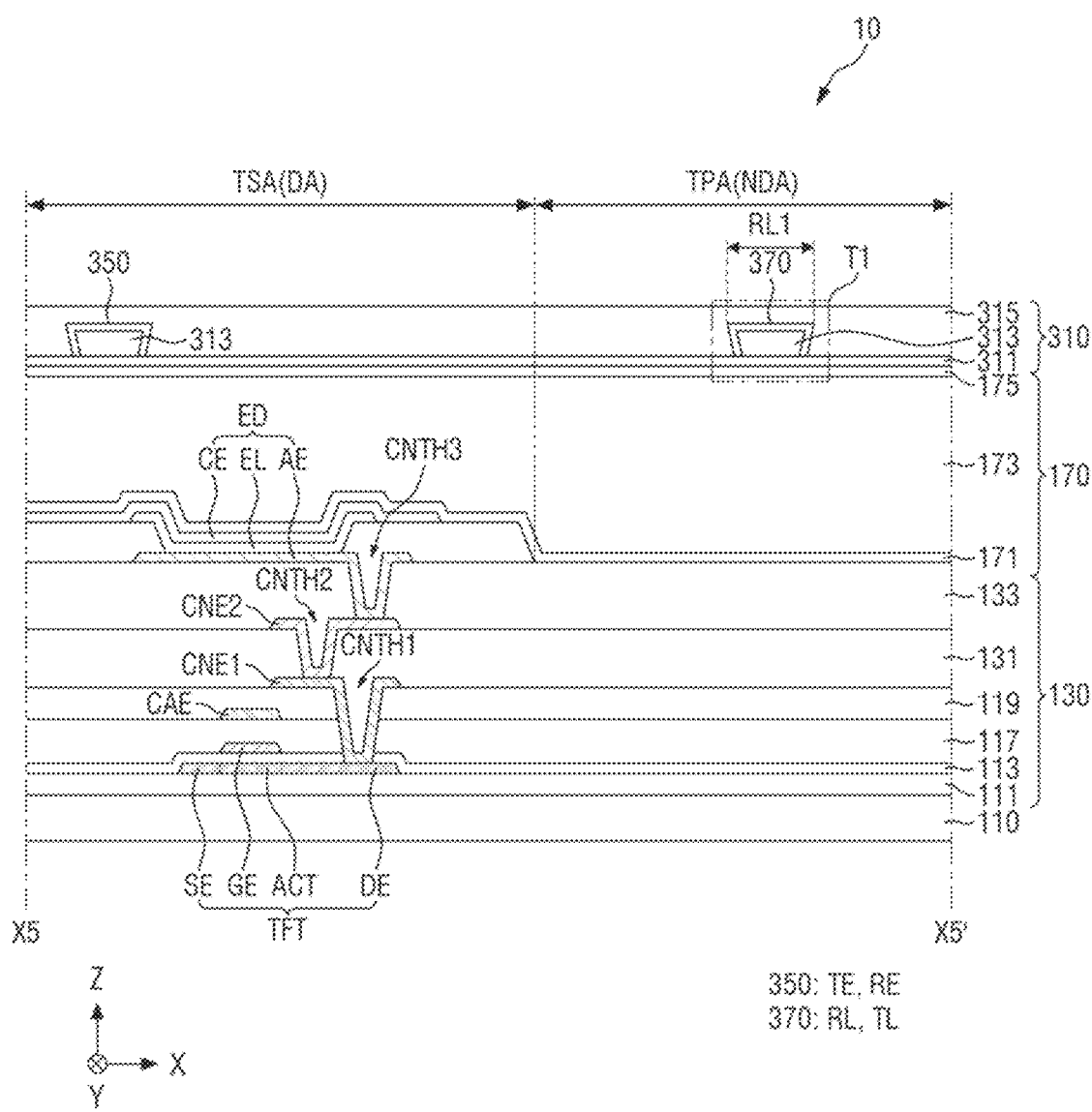
FIG. 15 is a cross-sectional view taken along line X5-X5' of FIG. 14.
Figure 16:
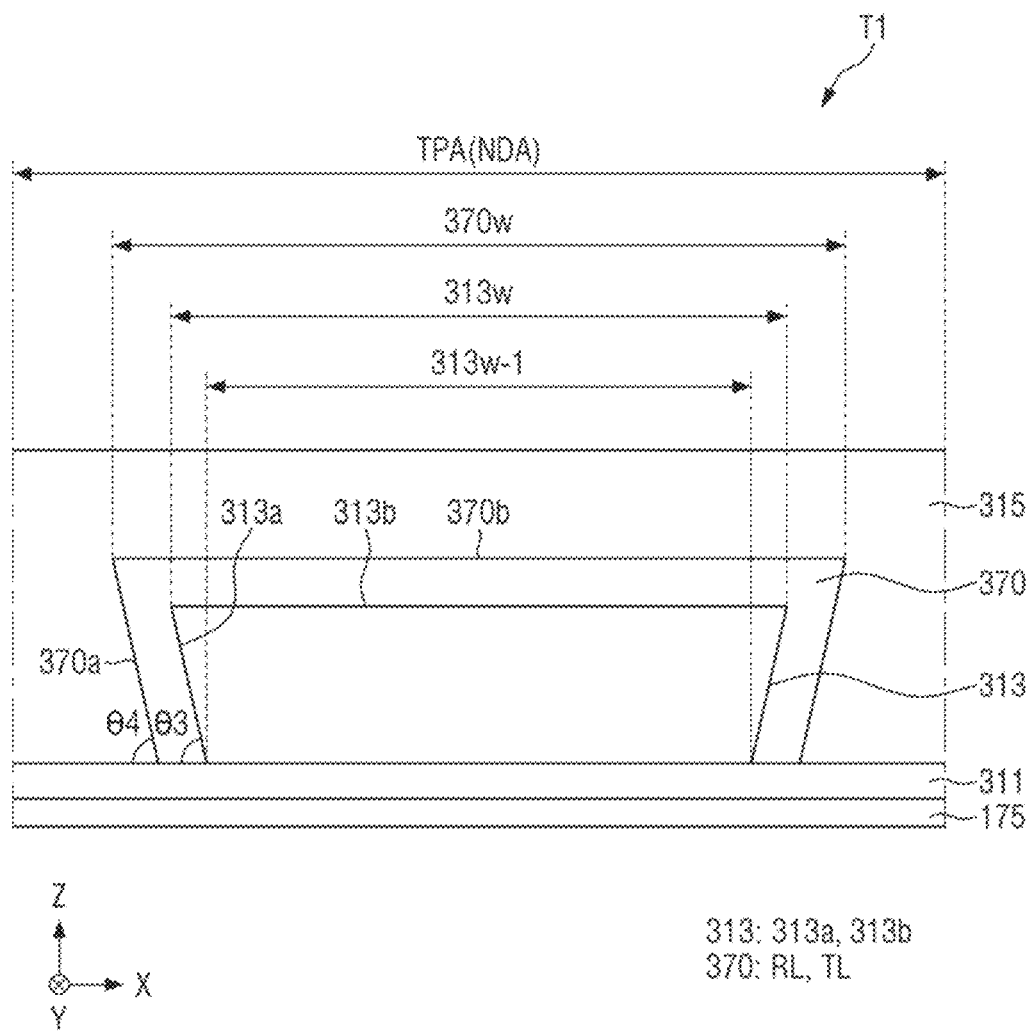
FIG. 16 is an enlarged cross-sectional view of area TI of FIG. 15.

FIG. 14 is an enlarged plan view of area T of FIG. 4. FIG. 15 is a cross-sectional view schematically showing the cross-section taken along line X5-X5' of FIG. 14. FIG. 16 is an enlarged cross-sectional view of area TI of FIG. 15.

As shown in FIG. 14, each of the first to twentieth sensing electrode groups RGI to RG20 among the plurality of sensing electrode groups RGI to RG40 may be connected to the respective sensing line RL on the left side of the touch sensing area TSA. For example, in an embodiment the first sensing electrode group RGI may be connected to the first sensing line RL1, and the twentieth sensing electrode group RG20 may be connected to the twentieth sensing line RL20.

The plurality of sensing lines RL1 to RL20 may be disposed in the touch peripheral area TPA disposed around the touch sensing area TSA. The sensing lines RL1 to RL20 may be disposed in the same layer as the second conductive layer 350 including the sensing electrodes RE and the driving electrode TE.

As shown in FIG. 15, the touch sensor area TSA may overlap with the display area DA, and the touch peripheral area TPA may overlap with the non-display area NDA.

The structure of the touch peripheral area TPA will be described in detail with reference to FIGS. 15 and 16. The touch peripheral area TPA may include a substrate 110, a buffer layer 111, a gate insulator 113, a first interlayer dielectric layer 117, a second interlayer dielectric layer 119, a first protective layer 131, a second protective layer 133, a thin-film encapsulation layer 170, and a touch sensor layer 310.

The touch peripheral area TPA is different from the touch sensor area TSA in that touch peripheral area TPA does not include the thin-film transistor TFT and the light-emitting element layer 150 at the lower portion.

The detailed descriptions have already been given above, and thus description will focus on the difference.

The touch sensor layer 310 in the touch peripheral area TPA includes a touch buffer layer 311, a touch insulating layer 313, and a third conductive layer 370 including sensing lines RL and driving lines TL (e.g., touch signal lines).

In an embodiment, the sensing lines RL and the driving lines TL including in the third conductive layer 370 may be made of one of molybdenum (Mo), aluminum (Al), chromium (Cr), gold (Au), titanium (Ti), nickel (Ni), neodymium (Nd) and copper (Cu), like the sensing electrodes RE and the driving electrodes TE. However, embodiments of the present disclosure are not necessarily limited thereto.

As described above, the sensing lines RL and the driving lines TL included in the third conductive layer 370 may be disposed in the same layer as the layer where the second conductive layer 350 is disposed. For example, the third conductive layer 370 may be disposed on the touch insulating layer 313 like the second conductive layer 350.

Referring to FIG. 16, the touch insulating layer 313 in the touch peripheral area TPA may include a first surface in direct contact with the touch buffer layer 311, a flat surface 313b facing the first surface in direct contact with the touch insulating layer 311, and an inclined surface 313a connecting the first surface with the flat surface 313b, like the touch insulating layer 313 in the touch sensing area TSA.

In some embodiments, the width 313w-1 (e.g., length in the first direction X) of the first surface of the touch insulating layer 313 in direct contact with the touch buffer layer 311 in the first direction X may be less than the width 313w (e.g., length in the first direction X) of the flat surface 313b. In addition, a third angle θ3 defined by the touch buffer layer 311 and the inclined surface 313a of the touch insulating layer 313 may be an acute angle where the inclined surface 313a of the touch insulating layer 313 is in direct contact with the third conductive layer 370. For example, the touch insulating layer 313 may have a reverse tapered shape in which the width 313w of the flat surface 313b is greater than the width 313w-1 of the first surface in direct contact with the touch buffer layer 311, and the third angle θ3 is an acute angle.

The third conductive layer 370 may be disposed on the touch insulating layer 313 to cover the inclined surface 313a and the flat surface 313b of the touch insulating layer 313. The third conductive layer 370 may include an inclined surface 370a and a flat surface 370b of the third conductive layer 370 covering the inclined surface 313a and the flat surface 313b of the touch insulating layer 313, respectively. The width 370w of the third conductive layer 370 may be greater than the width 313w of the touch insulating layer 313. In addition, a fourth angle θ4 defined by the touch buffer layer 311 and the inclined surface 370a of the third conductive layer 370 may be an acute angle where the inclined surface 370a of the third conductive layer 370 is in direct contact with the touch protective layer 315. For example, in the touch peripheral area TPA, the touch insulating layer 313 and the third conductive layer 370 may have a reverse tapered shape. The third conductive layer 370 may have a same shape as the second conductive layer 350 as previously described. For example, the third conductive layer 370 may include a first surface that faces the thin-film encapsulation layer 170 and which directly contacts the touch buffer layer 311. The flat surface 370b of the third conductive layer 370 may be a second surface that is opposite to the first surface. The second surface of the third conductive layer 370 may have a width (e.g., length in the first direction X) that is greater than a width (e.g., length in the first direction X) of the first surface of the third conductive layer 370.

Although only the sensing lines RL have been described for convenience of illustration, it is to be understood that other touch signal lines, such as a plurality of driving lines TL may also be included in the third conductive layer 370 and may have the structure as shown in FIG. 16.

While the present disclosure has been described with reference to non-limiting embodiments thereof, it will be understood by those of ordinary skill in the art that various changes in form and detail may be made thereto without departing from the spirit and scope of the present disclosure.

What is claimed is:

1. A display device comprising:
a substrate comprising an emission area and a non-emission area;
a light-emitting element overlapping with the emission area and disposed on the substrate;
a thin-film encapsulation layer overlapping with the emission area and the non-emission area and disposed on the light-emitting element; and
a touch sensor layer disposed on the thin-film encapsulation layer,
wherein the touch sensor layer comprises:
a first conductive layer disposed on the thin-film encapsulation layer;
a touch insulating layer disposed on the first conductive layer; and
a second conductive layer disposed on the touch insulating layer,
wherein the touch insulating layer overlaps with the non-emission area and comprises a first surface facing the thin-film encapsulation layer;
a second surface of the touch insulating layer is opposite to the first surface, the second surface has a width in a first direction that is greater than a width of the first surface in the first direction; and an inclined surface of the touch insulating layer connects the first surface with the second surface, and
wherein the second conductive layer covers the second surface and the inclined surface of the touch insulating layer, wherein outermost edges of the second conductive layer do not overlap the touch insulating layer in a plan view.

2. The display device of claim 1, wherein:
the first conductive layer overlaps with the non-emission area; and
the first conductive layer and the touch insulating layer are arranged in a mesh pattern,
wherein a width of the touch insulating layer in the first direction is greater than a width of the first conductive layer in the first direction.

3. The display device of claim 2, wherein the touch sensor layer further comprises:
a touch buffer layer overlapping with the non-emission area and disposed between the thin-film encapsulation layer and the touch insulating layer; and
a touch protective layer overlapping with the non-emission area and disposed on the second conductive layer, and
wherein an angle defined by the inclined surface of the touch insulating layer facing the touch protective layer and the touch buffer layer is an acute angle.

4. The display device of claim 3, wherein the touch insulating layer has a reverse tapered shape and comprises an insulating material.

5. The display device of claim 4, wherein the second conductive layer is a single layer made of a compound selected from molybdenum (Mo), aluminum (Al), chromium (Cr), gold (Au), titanium (Ti), nickel (Ni), neodymium (Nd) and copper (Cu) and an alloy thereof.

6. The display device of claim 2, further comprising:
a pixel-defining layer overlapping with the non-emission area and partially in contact with the light-emitting element;
a first opening overlapping with the emission area and defined by the pixel-defining layer; and
a second opening overlapping with the emission area and defined by the touch insulating layer.

7. The display device of claim 6, wherein a width of the second opening in the first direction is greater than a width of the first opening in the first direction.

8. The display device of claim 2, wherein:
the touch insulating layer covers both ends of the first conductive layer in the first direction; and
the touch insulating layer includes a touch contact hole penetrating through a center of the touch insulating layer,
wherein the first conductive layer and the second conductive layer are electrically connected with each other by the touch contact hole.

9. The display device of claim 2, wherein:
the non-emission area comprises a first area and a second area;
the first area and the second area include the touch insulating layer and the second conductive layer;
the first area includes the first conductive layer; and
the second area does not include the first conductive layer.

10. The display device of claim 9, wherein:
the first conductive layer comprises a connection electrode; and
the second conductive layer comprises a driving electrode and a sensing electrode.

11. The display device of claim 2, wherein the second conductive layer comprises:
a first metal layer disposed on the touch insulating layer;
a third metal layer disposed on the first metal layer; and
a second metal layer disposed between the first metal layer and the third metal layer,
wherein the third metal layer completely covers the first metal layer and the second metal layer, and
wherein a reflectance of the third metal layer is lower than reflectances of the first metal layer and the second metal layer.

12. The display device of claim 11, wherein:
the first metal layer and the third metal layer of the second conductive layer comprise titanium (Ti); and
the second metal layer is made of a compound selected from molybdenum (Mo), aluminum (Al), chromium (Cr), gold (Au), nickel (Ni), neodymium (Nd) and copper (Cu) and an alloy thereof.

13. A display device comprising:
a substrate comprising an emission area and a non-emission area;
a light-emitting element overlapping with the emission area and disposed on the substrate;
a thin-film encapsulation layer overlapping with the emission area and the non-emission area and disposed on the light-emitting element; and
a touch sensor layer disposed on the thin-film encapsulation layer,
wherein the touch sensor layer comprises:
a first conductive layer disposed on the thin-film encapsulation layer;
a touch insulating layer disposed on the first conductive layer; and
a second conductive layer disposed on the touch insulating layer,
wherein the second conductive layer overlaps with the non-emission area and comprises a first surface facing the thin-film encapsulation layer;
a second surface of the second conductive layer is opposite to the first surface and has a width in a first direction greater than a width of the first surface in the first direction; and an inclined surface of the second conductive layer connects the first surface with the second surface, and
wherein the second conductive layer has a reverse tapered shape and outermost edges of the second conductive layer do not overlap the touch insulating layer in a plan view.

14. The display device of claim 13, wherein:
the touch insulating layer overlaps with the non-emission area;
the first conductive layer and the touch insulating layer are arranged in a mesh pattern,
wherein a width of the touch insulating layer in the first direction is less than a width of the second conductive layer in the first direction.

15. The display device of claim 14, wherein the touch sensor layer further comprises:
a touch buffer layer disposed between the thin-film encapsulation layer and the touch insulating layer; and
a touch protective layer disposed on the second conductive layer, and
wherein an angle defined by the inclined surface of the second conductive layer facing the touch protective layer and the touch buffer layer is an acute angle.

16. A display device comprising:
a substrate comprising a display area and a non-display area, the display area comprising an emission area and a non-emission area;
a thin-film encapsulation layer overlapping with the display area and the non-display area and disposed on the substrate;
a touch insulating layer disposed on the thin-film encapsulation layer and overlapping with the non-emission area and the non-display area;
a touch electrode overlapping with the non-emission area and covering the touch insulating layer; and
a touch signal line overlapping with the non-display area and covering the touch insulating layer,
wherein the touch insulating layer has a reverse tapered shape, and
wherein the touch signal line comprises:
a first surface facing the thin-film encapsulation layer, a second surface of the touch signal line that is opposite to the first surface and has a width in a first direction that is greater than a width of the first surface in the first direction and outermost edges of the touch signal line do not overlap the touch insulating layer in a plan view; and
an inclined surface of the touch signal line connecting the first surface with the second surface, and covers the touch insulating layer.

17. The display device of claim 16, wherein a width of the touch insulating layer in the first direction is less than a width of the touch signal line.

18. The display device of claim 17, further comprising:
a touch buffer layer overlapping with the non-display area and disposed between the thin-film encapsulation layer and the touch insulating layer; and
a touch protective layer overlapping with the non-display area and disposed on the touch signal line,
wherein an angle formed by the touch buffer layer and the inclined surface facing the touch protective layer is an acute angle.

19. The display device of claim 18, wherein the touch signal line is connected to the touch electrode and has a reverse tapered shape.

20. The display device of claim 19, wherein the touch signal line is a single layer made of a compound selected from molybdenum (Mo), aluminum (Al), chromium (Cr), gold (Au), titanium (Ti), nickel (Ni), neodymium (Nd) and copper (Cu) and an alloy thereof.

* * * * *